(12) United States Patent
Chi et al.

(10) Patent No.: US 8,716,065 B2
(45) Date of Patent: May 6, 2014

(54) INTEGRATED CIRCUIT PACKAGING SYSTEM WITH ENCAPSULATION AND METHOD OF MANUFACTURE THEREOF

(75) Inventors: HeeJo Chi, Ichon-si (KR); NamJu Cho, Uiwang-si (KR); HanGil Shin, Seongnam-si (KR)

(73) Assignee: Stats Chippac Ltd., Singapore (SG)

( * ) Notice: Subject to any disclaimer, the term of this patent is extended or adjusted under 35 U.S.C. 154(b) by 229 days.

(21) Appl. No.: 13/243,886

(22) Filed: Sep. 23, 2011

(65) Prior Publication Data

US 2013/0075927 A1 Mar. 28, 2013

(51) Int. Cl.
| H01L 21/50 | (2006.01) |
| H01L 21/48 | (2006.01) |
| H01L 23/02 | (2006.01) |
| H01L 23/31 | (2006.01) |
| H01L 23/16 | (2006.01) |

(52) U.S. Cl.
USPC ........... 438/109; 438/126; 257/686; 257/774; 257/E23.133; 257/E23.145

(58) Field of Classification Search
USPC .......... 438/109, 126; 257/686, 774, E23.133, 257/E23.145
See application file for complete search history.

(56) References Cited

U.S. PATENT DOCUMENTS

| 6,717,253 | B2 | 4/2004 | Yang |
| 7,185,426 | B1 | 3/2007 | Hiner et al. |
| 7,239,164 | B2 | 7/2007 | Tamaki |
| 7,332,801 | B2 | 2/2008 | Low et al. |
| 7,429,798 | B2 | 9/2008 | Kim |
| 7,589,408 | B2 | 9/2009 | Weng et al. |
| 7,608,921 | B2 * | 10/2009 | Pendse ............................ 257/686 |
| 7,777,351 | B1 | 8/2010 | Berry et al. |
| 7,855,444 | B2 | 12/2010 | Camacho et al. |
| 7,868,443 | B2 | 1/2011 | Kwon et al. |
| 7,927,917 | B2 | 4/2011 | Pagaila et al. |
| 8,049,119 | B2 | 11/2011 | Beddingfield et al. |
| 8,067,831 | B2 | 11/2011 | Kwon et al. |
| 8,110,908 | B2 | 2/2012 | Kim et al. |
| 8,115,293 | B2 | 2/2012 | Moon et al. |
| 2006/0208349 | A1 | 9/2006 | Fukuda et al. |
| 2006/0279315 | A1 | 12/2006 | Takagi et al. |
| 2007/0117266 | A1 | 5/2007 | Ball |
| 2007/0262436 | A1 | 11/2007 | Kweon et al. |
| 2008/0157331 | A1 | 7/2008 | Onodera |
| 2008/0211084 | A1 * | 9/2008 | Chow et al. ................... 257/700 |
| 2008/0290505 | A1 | 11/2008 | Kolan et al. |
| 2009/0057881 | A1 | 3/2009 | Arana et al. |

(Continued)

FOREIGN PATENT DOCUMENTS

KR 1020090091487 A 8/2009

*Primary Examiner* — Luan C Thai
(74) *Attorney, Agent, or Firm* — Ishimaru & Associates LLP

(57) ABSTRACT

A method of manufacture of an integrated circuit packaging system includes: providing a base substrate; attaching a base integrated circuit on the base substrate; forming a base encapsulation, having a base encapsulation top side, on the base substrate and around the base integrated circuit; forming a base conductive via, having a base via head, through the base encapsulation and attached to the base substrate adjacent to the base integrated circuit, the base via head exposed from and coplanar with the base encapsulation top side; mounting an interposer structure over the base encapsulation with the interposer structure connected to the base via head; and forming an upper encapsulation on the base encapsulation top side and partially surrounding the interposer structure with a side of the interposer structure facing away from the base encapsulation exposed.

20 Claims, 4 Drawing Sheets

(56) References Cited

U.S. PATENT DOCUMENTS

| | | |
|---|---|---|
| 2009/0140408 A1* | 6/2009 | Lee et al. .................. 257/686 |
| 2009/0321919 A1 | 12/2009 | Sugino et al. |
| 2010/0214759 A1 | 8/2010 | Beddingfield et al. |
| 2010/0258931 A1 | 10/2010 | Yoshida et al. |
| 2010/0261311 A1 | 10/2010 | Tsuji |
| 2010/0301466 A1 | 12/2010 | Taoka et al. |
| 2011/0001240 A1 | 1/2011 | Merilo et al. |
| 2011/0049695 A1 | 3/2011 | Shin et al. |
| 2011/0111591 A1 | 5/2011 | Do et al. |
| 2011/0147911 A1 | 6/2011 | Kohl et al. |
| 2012/0025398 A1 | 2/2012 | Jang et al. |
| 2012/0074585 A1 | 3/2012 | Koo et al. |
| 2012/0104628 A1 | 5/2012 | Toh et al. |
| 2012/0119388 A1 | 5/2012 | Cho et al. |
| 2012/0208322 A1 | 8/2012 | Okada et al. |

\* cited by examiner

INTEGRATED CIRCUIT PACKAGING SYSTEM WITH ENCAPSULATION AND METHOD OF MANUFACTURE THEREOF

CROSS-REFERENCE TO RELATED APPLICATION

The present application contains subject matter related to concurrently filed U.S. patent application Ser. No. 13/243,699. The related application is assigned to STATS ChipPAC Ltd. and the subject matter thereof is incorporated herein by reference thereto.

TECHNICAL FIELD

The present invention relates generally to an integrated circuit packaging system, and more particularly to a system for interconnects.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for an integrated circuit system improved yield, low profile, and improved reliability. In view of the ever-increasing commercial competitive pressures, along with growing consumer expectations and the diminishing opportunities for meaningful product differentiation in the marketplace, it is increasingly critical that answers be found for these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate; attaching a base integrated circuit on the base substrate; forming a base encapsulation, having a base encapsulation top side, on the base substrate and around the base integrated circuit; forming a base conductive via, having a base via head, through the base encapsulation and attached to the base substrate adjacent to the base integrated circuit, the base via head exposed from and coplanar with the base encapsulation top side; mounting an interposer structure over the base encapsulation with the interposer structure connected to the base via head; and forming an upper encapsulation on the base encapsulation top side and partially surrounding the interposer structure with a side of the interposer structure facing away from the base encapsulation exposed.

The present invention provides an integrated circuit packaging system, including: a base substrate; a base integrated circuit attached on the base substrate; a base encapsulation, having a base encapsulation top side, on the base substrate and around the base integrated circuit, a base conductive via, having a base via head, through the base encapsulation and attached to the base substrate adjacent to the base integrated circuit, the base via head exposed from and coplanar with the base encapsulation top side; an interposer structure over the base encapsulation and connected to the base via head; and an upper encapsulation on the base encapsulation top side and partially surrounding the interposer structure with the side of the interposer structure facing away from the base encapsulation exposed.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
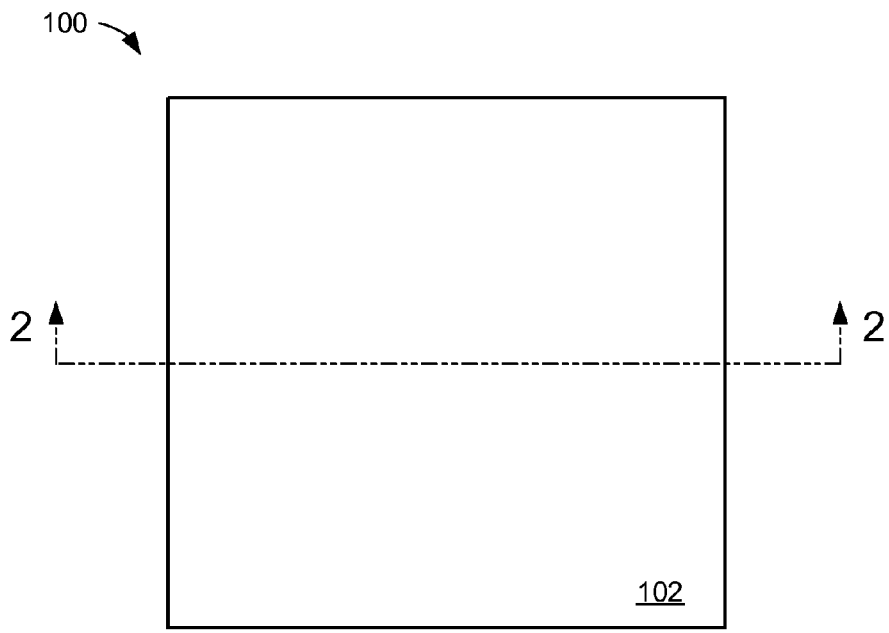
FIG. 1 is a top view of an integrated circuit packaging system.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, Although the Views in the Drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit active side, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements or components with no intervening material.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100. The top view depicts a mountable device encapsulation 102. The mountable device encapsulation 102 is defined as a protective cover that has electric and environmental insulating properties providing a hermetic seal. As an example, the mountable device encapsulation 102 can be a molded encapsulation material, such as epoxy molding compound or ceramic material.

For illustrative purposes, the integrated circuit packaging system 100 is shown with the mountable device encapsulation 102 having a square geometric shape although it is understood that the mountable device encapsulation 102 can have a different geometric shape. For example, the mountable device encapsulation 102 can have a rectangular geometric shape or an octagonal geometric shape.

Figure 2:
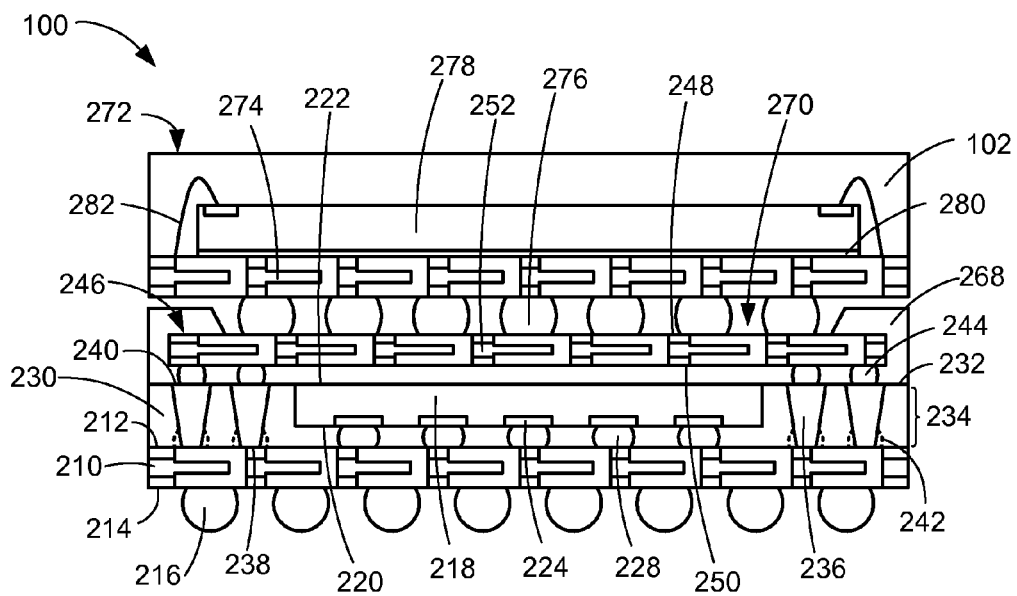
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The cross-sectional view depicts a base substrate 210. The base substrate 210 is defined as a rigid structure that provides support and connectivity for mounting other components and devices. As an example, the base substrate 210 can be a laminated substrate or a ceramic substrate. As a further example, the laminated substrate can be a layered substrate having vias and intermetallic layers. As a specific example, the base substrate 210 can be a printed circuit board.

The base substrate 210 can have a base substrate first side 212 and a base substrate second side 214. The base substrate first side 212 and the base substrate second side 214 can be the opposing horizontal sides of the base substrate 210 with the base substrate second side 214 facing away from the base substrate first side 212.

External interconnects 216 can be connected to the base substrate second side 214. The external interconnects 216 are defined as conductive connectors that provide connectivity between a packaging system and other devices and components. As an example, the external interconnects 216 can be solder balls, solder bumps, conductive pillars, or conductive bumps. The external interconnects 216 can connect the integrated circuit packaging system 100 to a next system level down (not shown).

A base integrated circuit 218 can be attached to the base substrate first side 212. The base integrated circuit 218 is defined as an active device having active circuitry fabricated thereon. As an example, the base integrated circuit 218 can be a semiconductor die, a thin semiconductor die, a wirebond die, or a flip chip.

The base integrated circuit 218 can have a base circuit active side 220 and a base circuit non-active side 222. The base circuit active side 220 is defined as the side of the base integrated circuit 218 having active circuitry fabricated thereon (not shown). The base circuit active side 220 can face the base substrate first side 212. The base circuit active side 220 can be parallel with the base circuit active side 220.

The base circuit non-active side 222 is defined as the side of the base integrated circuit 218 opposite the base circuit active side 220. The base circuit non-active side 222 can face away from the base substrate first side 212. The base circuit non-active side 222 can be parallel with the base circuit active side 220.

The base integrated circuit 218 can include base circuit pads 224. The base circuit pads 224 are defined as conductive pads that provide electrical connectivity for an integrated circuit from connective devices or structures. The base circuit pads 224 can be along the base circuit active side 220.

Circuit interconnects 228 can connect the base integrated circuit 218 to the base substrate 210. The circuit interconnects 228 are defined as conductive structures for providing electrical connection between elements, devices, and other structures. As an example, the circuit interconnects 228 solder balls, solder bumps, conductive pillars, or conductive bumps. The circuit interconnects 228 can be attached to the base circuit pads 224. The circuit interconnects 228 can be connected between the base circuit active side 220 and the base substrate first side 212.

A base encapsulation 230 can be on and cover the base substrate first side 212. The base encapsulation 230 is defined as a protective cover that has electric and environmental insulating properties providing a hermetic seal. As an example, the base encapsulation 230 can be a molded encapsulation material, such as epoxy molding compound or ceramic material.

The base encapsulation 230 can be around a portion of the base integrated circuit 218. The base encapsulation 230 can cover the base circuit active side 220 and the vertical sides of the base integrated circuit 218. The base encapsulation 230 can fill the space between the base integrated circuit 218 and the base substrate 210. The base encapsulation 230 can surround or encapsulate the circuit interconnects 228.

The base encapsulation 230 can include a base encapsulation top side 232. The base encapsulation top side 232 is defined as the horizontal surface facing away from the base substrate 210. The base encapsulation top side 232 can be parallel with the base substrate first side 212. The base circuit non-active side 222 can be exposed along and coplanar with the base encapsulation top side 232.

The base encapsulation 230 can have a base encapsulation thickness 234. The base encapsulation thickness 234 is defined as the vertical thickness between the base substrate first side 212 and the base encapsulation top side 232. The base encapsulation thickness 234 can be equivalent to the distance between the base substrate first side 212 and the base circuit non-active side 222.

Base conductive vias 236 can be in and surrounded by the base encapsulation 230. The base conductive vias 236 are defined as conductive structures in a protective cover that provide electrical connectivity and extend between a side of a substrate and a surface of the protective cover. The base conductive vias 236 can be adjacent to the vertical sides of the base integrated circuit 218.

The base conductive vias 236 can extend vertically through the base encapsulation 230. The base conductive vias 236 can be attached to the base substrate 210 at one end of the base conductive vias 236 and exposed from the base encapsulation 230 at the opposing end of the base conductive vias 236.

The base conductive vias 236 can be a conductive structure formed from filling a hole or via (not shown) in the base encapsulation 230 with conductive material. As an example, the base conductive vias 236 can be made from conductive material, such as a copper alloy, gold, a gold alloy, nickel, a nickel alloy, or other alloys. The hole or via in the base encapsulation 230 can be formed by a laser ablation process. The hole or via can be formed to extend from the base encapsulation top side 232 to the base substrate first side 212.

Optionally, base buffer connectors 242, as depicted by the curved dashed lines, can be on the base substrate 210. The base buffer connectors 242 are defined as a physical buffer having electrically conductive properties that protects a substrate from damage during a laser drilling or ablation process. As an example, the base buffer connectors 242 prevent damage to the base substrate 210 during formation of the holes or vias for the base conductive vias 236 by functioning as a physical barrier for the base substrate 210.

The base buffer connectors 242 can be between the base substrate first side 212 and the base conductive vias 236. The base conductive vias 236 can be formed into the base buffer connectors 242.

The base conductive vias 236 can have a base via tip 238 and a base via head 240. The base via head 240 can be the portion of the base via tip 238 that is attached to the base substrate first side 212. The base via head 240 can be electrically connected to pads along the base substrate first side 212.

The base via head 240 is defined as the end of the base conductive vias 236 for providing connectivity to devices or structures stacked on the base conductive vias 236. The base via head 240 can be the portion of the base conductive vias 236 at end of the base conductive vias 236 opposite the base via tip 238. The base via head 240 can be exposed from the base encapsulation 230 along the base encapsulation top side 232. The base via head 240 can be coplanar with the base encapsulation top side 232.

The base conductive vias 236 can have a tapered shape. A tapered shape is defined as a shape having a narrowing width with one end having a greater width than an opposing end. For example, the base via head 240 can have a greater width than the base via tip 238.

Interposer interconnects 244 can be attached to the base via head 240. The interposer interconnects 244 are defined as conductive structures that provide electrical connection between elements, devices, and other structures. As an example, the interposer interconnects 244 solder balls, solder bumps, conductive pillars, or conductive bumps. The interposer interconnects 244 can be attached to the base via head 240.

An interposer structure 246 can be mounted over the base encapsulation 230 and the base integrated circuit 218. The interposer structure 246 is defined as a partially encapsulated rigid structure that provides a surface connecting and mounting additional devices to a packaged device. As an example, the interposer structure 246 can be a partially encapsulated substrate or a partially encapsulated packaged semiconductor stacking module having sites for external electrical connection.

The interposer structure 246 can have an interposer first side 248 and an interposer second side 250. The interposer first side 248 is defined as the horizontal side of the interposer structure 246 facing away from the base encapsulation 230. The interposer second side 250 is defined as the horizontal side of the interposer structure 246 opposite the interposer first side 248. The interposer second side 250 can face the base encapsulation 230.

The interposer structure 246 can be attached to the base conductive vias 236 with the interposer interconnects 244. The interposer interconnects 244 can provide a vertical offset between the interposer structure 246 and the base encapsulation 230, the base integrated circuit 218, or a combination thereof. The interposer interconnects 244 can be attached to the interposer second side 250.

The interposer structure 246 can include an interposer substrate 252. The interposer substrate 252 is defined as a rigid structure that provides support and connectivity for mounting other components and devices. As an example, the interposer substrate 252 can be a laminated substrate or a ceramic substrate. As a further example, the laminated substrate can be a layered substrate having vias and intermetallic layers. As a specific example, the interposer substrate 252 can be a printed circuit board.

The interposer first side 248 can be the horizontal side of the interposer substrate 252 facing away from the base encapsulation 230. The interposer second side 250 can be the horizontal side of the interposer substrate 252 facing the base encapsulation 230.

An upper encapsulation 268 can be over the base encapsulation 230. The upper encapsulation 268 is defined as a protective cover that has electric and environmental insulating properties providing a hermetic seal. As an example, the upper encapsulation 268 can be a molded encapsulation material, such as epoxy molding compound or ceramic material.

The interface between the base encapsulation 230 and the upper encapsulation 268 can be along a single horizontal plane at the base encapsulation top side 232. The vertical sides of the upper encapsulation 268 can be coplanar with the vertical sides of the base encapsulation 230.

The upper encapsulation 268 can be on and entirely cover the base encapsulation top side 232. The upper encapsulation 268 can fill the space between the interposer structure 246 and the base encapsulation top side 232. The upper encapsulation 268 can surround or encapsulate the interposer interconnects 244.

The upper encapsulation 268 can be on and cover the base circuit non-active side 222. The upper encapsulation 268 can fill the space between the interposer structure 246 and the base circuit non-active side 222.

The interposer structure 246 can be partially surrounded by the upper encapsulation 268. The upper encapsulation 268 can cover the vertical sides of the interposer structure 246. The interposer first side 248 of the interposer structure 246 can be exposed from the upper encapsulation 268. The interposer structure 246 can be exposed in a recess 270 in the side of the upper encapsulation 268 facing away from the base encapsulation 230. More specifically, the interposer substrate 252 can be exposed in the recess 270.

The upper encapsulation 268 can be on a peripheral portion of the interposer first side 248. The peripheral portion is defined as the portions along the perimeter of a horizontal surface.

The integrated circuit packaging system 100 can include a mountable device 272. The mountable device 272 is defined as a packaged integrated circuit device. The mountable device 272 can be over the interposer substrate 252 of the interposer structure 246.

The mountable device 272 can be attached to the portion of the interposer substrate 252 exposed from the upper encapsulation 268. The mountable device 272 attached to the interposer structure 246 can form an integrated circuit package-on-package system.

The mountable device 272 can include a device substrate 274. The device substrate 274 is defined as a rigid structure that provides support and connectivity for mounting other components and devices. As an example, the device substrate 274 can be a laminated substrate or a ceramic substrate. As a further example, the laminated substrate can be a layered substrate having vias and intermetallic layers. As a specific example, the device substrate 274 can be a printed circuit board. The device substrate 274 can be attached to the portion of the interposer substrate 252 exposed from the upper encapsulation 268.

The device substrate 274 of the mountable device 272 can be connected to the interposer substrate 252 of the interposer structure 246 with a mountable interconnects 276. The mountable interconnects 276 is defined as conductive structures for providing electrical connection between elements, devices, and other structures. As an example, the mountable interconnects 276 solder balls, solder bumps, conductive pillars, or conductive bumps.

A mountable integrated circuit 278 can be mounted on the device substrate 274. The mountable integrated circuit 278 is defined as an active device having active circuitry fabricated thereon (not shown). As an example, the mountable integrated circuit 278 can be a semiconductor die, a wirebond die, a think semiconductor die, or a flip chip.

The mountable integrated circuit 278 can be attached to the device substrate 274 with a device adhesive 280. The device adhesive 280 is defined as a material for physically bonding or adhering two or more components to each other. For example, the device adhesive 280 can be an epoxy or polymer adhesive, a b-stage or partially cured adhesive material, or a thermally conductive adhesive material. The device adhesive 280 can be between the device substrate 274 and the side of the mountable integrated circuit 278 facing the device substrate 274.

The mountable integrated circuit 278 can be connected to the device substrate 274 with mountable device interconnects 282. The mountable device interconnects 282 is defined as a conductive structures for providing electrical connection between elements, devices, and other structures. For example, the mountable device interconnects 282 can be a bond wire or a ribbon bond wire.

The mountable device interconnects 282 can connect between the device substrate 274 and the side of the mountable integrated circuit 278 having the active circuitry. The mountable device interconnects 282 can provide electrical connectivity between the mountable integrated circuit 278 and the device substrate 274.

The mountable device 272 can include the mountable device encapsulation 102. The mountable device encapsulation 102 can be on the side of the device substrate 274 facing away from the upper encapsulation 268. The mountable device encapsulation 102 can surround or encapsulate the mountable integrated circuit 278, the device adhesive 280 and the mountable device interconnects 282.

It has been discovered that the present invention provides the integrated circuit packaging system 100, with the base conductive vias 236, having increased through connection within and between packaged devices. The base conductive vias 236 can enable manufacture of through interconnects having finer pitch, thus improving through connection within and between packaged devices, such as connection through the base encapsulation 230 to the interposer structure 246 and the mountable device 272.

It has also been discovered that the present invention provides the integrated circuit packaging system 100, with the base conductive vias 236, having reliable connectivity. The base conductive vias 236 having the tapered shape with the base via tip 238 enables precise connection with the base substrate 210 which reduces or eliminates the risk of shorting, providing the integrated circuit packaging system 100 having reliable connectivity.

It has further been discovered that the present invention provides the integrated circuit packaging system 100, with the base conductive vias 236 including the base via head 240, having robust interconnection. The base via head 240 having a width greater than the base via tip 238 provides a wider surface for attaching the interposer interconnects 244 which provide robust interconnection between the base conductive vias 236 and the interposer interconnects 244 of the integrated circuit packaging system 100.

It has further been discovered that the present invention provides the integrated circuit packaging system 100 with the base conductive vias 236 and the interposer interconnects 244 improves throughput. The base conductive vias 236 connected to the interposer interconnects 244 enable reduced manufacturing time compared to other vertical connections, such as bondwires, when forming electrical connections between structures, components and devices, such as the interposer structure 246 of the integrated circuit packaging system 100.

It has further been discovered the present invention provides the integrated circuit packaging system 100, with the base encapsulation 230 including the base encapsulation thickness 234, having reduced process time. The base encapsulation 230 having the base encapsulation thickness 234 equivalent to the distance between the base substrate first side 212 and the base circuit non-active side 222 reduces the distance and time required for the laser ablation process when forming the base conductive vias 236 of the integrated circuit packaging system 100.

It has further been discovered the present invention provides the integrated circuit packaging system 100, with the base encapsulation 230 including the base encapsulation thickness 234, having a low vertical package profile. The base encapsulation 230 having the base encapsulation thickness 234 equivalent to the distance between the base substrate first side 212 and the base circuit non-active side 222 enables uniform reduction in package height for the base encapsulation 230 and the base integrated circuit 218 providing the integrated circuit packaging system 100 having a low profile.

It has further been discovered the present invention provides the integrated circuit packaging system 100 with the base buffer connectors 242 prevents damage to the base substrate 210 during the via formation process. The base buffer connectors 242 provide a stable buffer which reduces manufacture sensitivity to light intensity variation in laser-ablating and drill tip height control or substrate thickness variation in mechanical drilling, preventing damage to the base substrate 210 of the integrated circuit packaging system 100.

It has further been discovered the present invention provides the integrated circuit packaging system 100 with the base buffer connectors 242 reduces process time. The base buffer connectors 242 reduces process time and reduces cost by eliminating the need for the base conductive vias 236 to extend to the base substrate 210 of the integrated circuit packaging system 100.

It has further been discovered the present invention provides the integrated circuit packaging system 100 with the interposer interconnects 244 improves reliability. The interposer interconnects 244 provide a vertical offset between the base integrated circuit 218 and the interposer structure 246 preventing shorting which improves reliability of the integrated circuit packaging system 100.

It has further been discovered the present invention provides the integrated circuit packaging system 100 with the upper encapsulation 268 having improved structural integrity. The upper encapsulation 268 formed over the peripheral portion of the interposer structure 246 prevents or eliminates the risk of disconnection from the interposer interconnects 244 by securing the interposer structure 246 in place which improves structure integrity of the integrated circuit packaging system 100.

It has further been discovered the present invention provides the integrated circuit packaging system 100 with the interposer structure 246 having increased connectivity. The interposer structure 246 exposed from the upper encapsulation 268 provides increased number of input and output sites for connect to other devices, components, and structures, such as the mountable device 272 of the integrated circuit packaging system 100.

Figure 3:
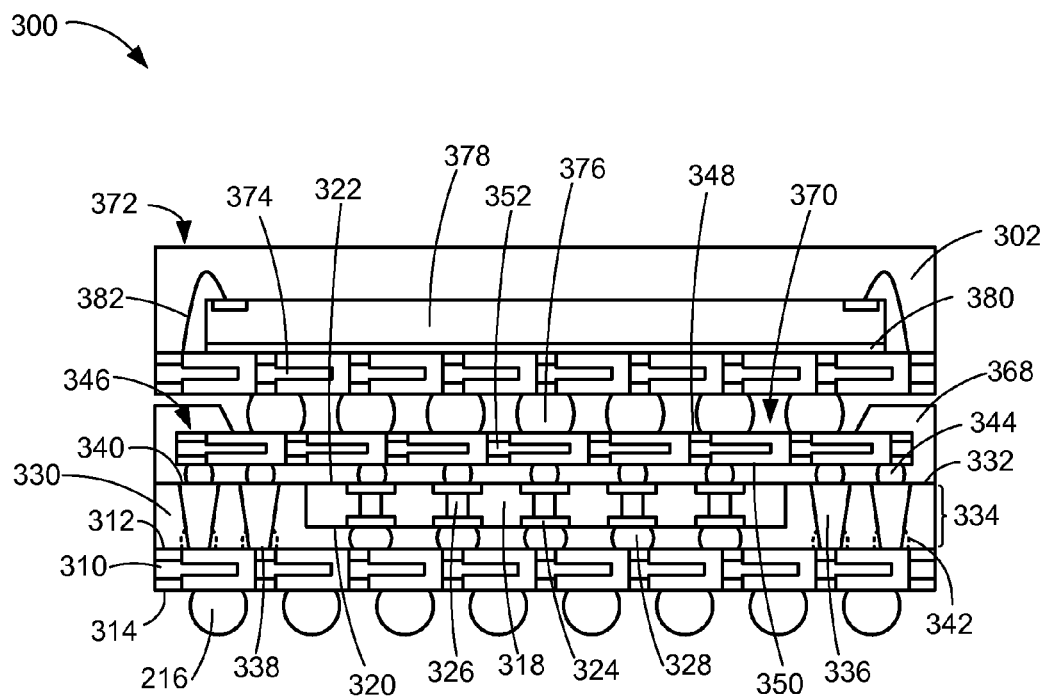
FIG. 3 is a cross-sectional view of an integrated circuit packaging system as exemplified by the line 2-2 of FIG. 1 in a second embodiment of the present invention.

Referring now to FIG. 3, therein is shown a cross-sectional view of an integrated circuit packaging system 300 as exemplified by the line 2-2 of FIG. 1 in a second embodiment of the present invention. The cross-sectional view depicts a base substrate 310. The base substrate 310 is defined as a rigid structure that provides support and connectivity for mounting other components and devices. As an example, the base substrate 310 can be a laminated substrate or a ceramic substrate. As a further example, the laminated substrate can be a layered substrate having vias and intermetallic layers. As a specific example, the base substrate 310 can be a printed circuit board.

The base substrate 310 can have a base substrate first side 312 and a base substrate second side 314. The base substrate first side 312 and the base substrate second side 314 can be the opposing horizontal sides of the base substrate 310 with the base substrate second side 314 facing away from the base substrate first side 312.

External interconnects 316 can be connected to the base substrate second side 314. The external interconnects 316 are defined as conductive connectors that provide connectivity between a packaging system and other devices and components. As an example, the external interconnects 316 solder balls, solder bumps, conductive pillars, or conductive bumps. The external interconnects 316 can connect the integrated circuit packaging system 300 to a next system level down (not shown).

A base integrated circuit 318 can be attached to the base substrate first side 312. The base integrated circuit 318 is defined as an active device having active circuitry fabricated thereon. As an example, the base integrated circuit 318 can be a semiconductor die, a thin semiconductor die, a wirebond die, or a flip chip.

The base integrated circuit 318 can have a base circuit active side 320 and a base circuit non-active side 322. The base circuit active side 320 is defined as the side of the base integrated circuit 318 having active circuitry fabricated thereon (not shown). The base circuit active side 320 can face the base substrate first side 312. The base circuit active side 320 can be parallel with the base circuit active side 320.

The base circuit non-active side 322 is defined as the side of the base integrated circuit 318 opposite the base circuit active side 320. The base circuit non-active side 322 can face away from the base substrate first side 312. The base circuit non-active side 322 can be parallel with the base circuit active side 320.

The base integrated circuit 318 can include base circuit pads 324. The base circuit pads 324 are defined as conductive pads that provide electrical connectivity for an integrated circuit from connective devices or structures. The base circuit pads 324 can be along the base circuit active side and the base circuit non-active side 322.

The base integrated circuit 318 can include base circuit vias 326. The base circuit vias 326 are defined as channels or holes filled with conductive material that extends from one surface of a semiconductor device to an opposite surface of the semiconductor device. The base circuit vias 326 can be filled with a conductive material. For example, the base circuit vias 326 can be filled with conductive materials such as copper, a copper alloy, gold, a gold alloy, nickel, a nickel alloy, or other alloys.

The base circuit vias 326 can extend through the base integrated circuit 318 from the base circuit active side 320 to the base circuit non-active side 322. The base circuit vias 326 can connect between one of the base circuit pads 324 at the base circuit active side 320 and another one of the base circuit pads 324 at the base circuit non-active side 322.

Circuit interconnects 328 can connect the base integrated circuit 318 to the base substrate 310. The circuit interconnects 328 are defined as conductive structures for providing electrical connection between elements, devices, and other structures. As an example, the circuit interconnects 328 solder balls, solder bumps, conductive pillars, or conductive bumps. The circuit interconnects 328 can be attached to the base circuit pads 324. The circuit interconnects 328 can be connected between the base circuit active side 320 and the base substrate first side 312.

A base encapsulation 330 can be on and cover the base substrate first side 312. The base encapsulation 330 is defined as a protective cover that has electric and environmental insulating properties providing a hermetic seal. As an example, the base encapsulation 330 can be a molded encapsulation material, such as epoxy molding compound or ceramic material.

The base encapsulation 330 can be around a portion of the base integrated circuit 318. The base encapsulation 330 can cover the base circuit active side 320 and the vertical sides of the base integrated circuit 318. The base encapsulation 330 can fill the space between the base integrated circuit 318 and the base substrate 310. The base encapsulation 330 can surround or encapsulate the circuit interconnects 328.

The base encapsulation 330 can include a base encapsulation top side 332. The base encapsulation top side 332 is defined as the horizontal surface facing away from the base substrate 310. The base encapsulation top side 332 can be parallel with the base substrate first side 312. The base circuit non-active side 322 can be exposed along and coplanar with the base encapsulation top side 332.

The base encapsulation 330 can have a base encapsulation thickness 334. The base encapsulation thickness 334 is defined as the vertical thickness between the base substrate first side 312 and the base encapsulation top side 332. The base encapsulation thickness 334 can be equivalent to the distance between the base substrate first side 312 and the base circuit non-active side 322.

Base conductive vias 336 can be in and surrounded by the base encapsulation 330. The base conductive vias 336 are defined as conductive structures in a protective cover that provide electrical connectivity and extend between a side of a substrate and a surface of the protective cover. The base conductive vias 336 can be adjacent to the vertical sides of the base integrated circuit 318.

The base conductive vias 336 can extend vertically through the base encapsulation 330. The base conductive vias 336 can be attached to the base substrate 310 at one end of the base conductive vias 336 and exposed from the base encapsulation 330 at the opposing end of the base conductive vias 336.

The base conductive vias 336 can be a conductive structure formed from filling a hole or via (not shown) in the base encapsulation 330 with conductive material. As an example, the base conductive vias 336 can be made from conductive material, such as a copper alloy, gold, a gold alloy, nickel, a nickel alloy, or other alloys. The hole or via in the base encapsulation 330 can be formed by a laser ablation process. The hole or via can be formed to extend from the base encapsulation top side 332 to the base substrate first side 312.

Optionally, base buffer connectors 342, as depicted by the curved dashed lines, can be on the base substrate 310. The base buffer connectors 342 are defined as a physical buffer having electrically conductive properties that protects a substrate from damage during a laser drilling or ablation process. As an example, the base buffer connectors 342 prevent damage to the base substrate 310 during formation of the holes or vias for the base conductive vias 336 by functioning as a physical barrier for the base substrate 310.

The base buffer connectors 342 can be between the base substrate first side 312 and the base conductive vias 336. The base conductive vias 336 can be formed into the base buffer connectors 342.

The base conductive vias 336 can have a base via tip 338 and a base via head 340. The base via head 340 can be the portion of the base via tip 338 that is attached to the base substrate first side 312. The base via head 340 can be electrically connected to pads along the base substrate first side 312.

The base via head 340 is defined as the end of the base conductive vias 336 for providing connectivity to devices or structures stacked on the base conductive vias 336. The base via head 340 can be the portion of the base conductive vias 336 at end of the base conductive vias 336 opposite the base via tip 338. The base via head 340 can be exposed from the base encapsulation 330 along the base encapsulation top side 332. The base via head 340 can be coplanar with the base encapsulation top side 332.

The base conductive vias 336 can have a tapered shape. A tapered shape is defined as a shape having a narrowing width with one end having a greater width than an opposing end. For example, the base via head 340 can have a greater width than the base via tip 338.

Interposer interconnects 344 can be attached to the base via head 340. The interposer interconnects 344 are defined as conductive structures that provide electrical connection between elements, devices, and other structures. As an example, the interposer interconnects 344 solder balls, solder bumps, conductive pillars, or conductive bumps. The interposer interconnects 344 can be attached to the base via head 340 and the base circuit pads 324 at the base circuit non-active side 322.

An interposer structure 346 can be mounted over the base encapsulation 330 and the base integrated circuit 318. The interposer structure 346 is defined as a partially encapsulated rigid structure that provides a surface connecting and mounting additional devices to a packaged device. As an example, the interposer structure 346 can be a partially encapsulated substrate or a partially encapsulated packaged semiconductor stacking module having sites for external electrical connection.

The interposer structure 346 can have an interposer first side 348 and an interposer second side 350. The interposer first side 348 is defined as the horizontal side of the interposer structure 346 facing away from the base encapsulation 330. The interposer second side 350 is defined as the horizontal side of the interposer structure 346 opposite the interposer first side 348. The interposer second side 350 can face the base encapsulation 330.

The interposer structure 346 can be attached to the base conductive vias 336 with the interposer interconnects 344. The interposer interconnects 344 can provide a vertical offset between the interposer structure 346 and the base encapsulation 330, the base integrated circuit 318, or a combination thereof. The interposer interconnects 344 can be attached to the interposer second side 350.

The interposer structure 346 can include an interposer substrate 352. The interposer substrate 352 is defined as a rigid structure that provides support and connectivity for mounting other components and devices. As an example, the interposer substrate 352 can be a laminated substrate or a ceramic substrate. As a further example, the laminated substrate can be a layered substrate having vias and intermetallic layers. As a specific example, the interposer substrate 352 can be a printed circuit board.

The interposer first side 348 can be the horizontal side of the interposer substrate 352 facing away from the base encapsulation 330. The interposer second side 350 can be the horizontal side of the interposer substrate 352 facing the base encapsulation 330.

An upper encapsulation 368 can be over the base encapsulation 330. The upper encapsulation 368 is defined as a protective cover that has electric and environmental insulating properties providing a hermetic seal. As an example, the upper encapsulation 368 can be a molded encapsulation material, such as epoxy molding compound or ceramic material.

The interface between the base encapsulation 330 and the upper encapsulation 368 can be along a single horizontal plane at the base encapsulation top side 332. The vertical sides of the upper encapsulation 368 can be coplanar with the vertical sides of the base encapsulation 330.

The upper encapsulation 368 can be on and entirely cover the base encapsulation top side 332. The upper encapsulation 368 can fill the space between the interposer structure 346 and the base encapsulation top side 332. The upper encapsulation 368 can surround or encapsulate the interposer interconnects 344.

The upper encapsulation 368 can be on and cover the base circuit non-active side 322. The upper encapsulation 368 can fill the space between the interposer structure 346 and the base circuit non-active side 322.

The interposer structure 346 can be partially surrounded by the upper encapsulation 368. The upper encapsulation 368 can cover the vertical sides of the interposer structure 346. The interposer first side 348 of the interposer structure 346 can be exposed from the upper encapsulation 368. The interposer structure 346 can be exposed in a recess 370 in the side of the upper encapsulation 368 facing away from the base encapsulation 330. More specifically, the interposer substrate 352 can be exposed in the recess 370.

The upper encapsulation 368 can be on a peripheral portion of the interposer first side 348. The peripheral portion is defined as the portions along the perimeter of a horizontal surface.

The integrated circuit packaging system 300 can include a mountable device 372. The mountable device 372 is defined as a packaged integrated circuit device. The mountable device 372 can be over the interposer substrate 352 of the interposer structure 346.

The mountable device 372 can be attached to the portion of the interposer substrate 352 exposed from the upper encapsulation 368. The mountable device 372 attached to the interposer structure 346 can form an integrated circuit package-on-package system.

The mountable device 372 can include a device substrate 374. The device substrate 374 is defined as a rigid structure that provides support and connectivity for mounting other components and devices. As an example, the device substrate 374 can be a laminated substrate or a ceramic substrate. As a further example, the laminated substrate can be a layered substrate having vias and intermetallic layers. As a specific example, the device substrate 374 can be a printed circuit board. The device substrate 374 can be attached to the portion of the interposer substrate 352 exposed from the upper encapsulation 368.

The device substrate 374 of the mountable device 372 can be connected to the interposer substrate 352 of the interposer structure 346 with a mountable interconnects 376. The mountable interconnects 376 is defined as conductive structures for providing electrical connection between elements, devices, and other structures. As an example, the mountable interconnects 376 solder balls, solder bumps, conductive pillars, or conductive bumps.

A mountable integrated circuit 378 can be mounted on the device substrate 374. The mountable integrated circuit 378 is defined as an active device having active circuitry fabricated thereon (not shown). As an example, the mountable integrated circuit 378 can be a semiconductor die, a wirebond die, a think semiconductor die, or a flip chip.

The mountable integrated circuit 378 can be attached to the device substrate 374 with a device adhesive 380. The device adhesive 380 is defined as a material for physically bonding or adhering two or more components to each other. For example, the device adhesive 380 can be an epoxy or polymer adhesive, a b-stage or partially cured adhesive material, or a thermally conductive adhesive material. The device adhesive 380 can be between the device substrate 374 and the side of the mountable integrated circuit 378 facing the device substrate 374.

The mountable integrated circuit 378 can be connected to the device substrate 374 with mountable device interconnects 382. The mountable device interconnects 382 is defined as a conductive structures for providing electrical connection between elements, devices, and other structures. For example, the mountable device interconnects 382 can be a bond wire or a ribbon bond wire.

The mountable device interconnects 382 can connect between the device substrate 374 and the side of the mountable integrated circuit 378 having the active circuitry. The mountable device interconnects 382 can provide electrical connectivity between the mountable integrated circuit 378 and the device substrate 374.

The mountable device 372 can include a mountable device encapsulation 302. The mountable device encapsulation 302 is defined as a protective cover that has electric and environmental insulating properties providing a hermetic seal. As an example, the mountable device encapsulation 302 can be a molded encapsulation material, such as epoxy molding compound or ceramic material.

The mountable device encapsulation 302 can be on the side of the device substrate 374 facing away from the upper encapsulation 368. The mountable device encapsulation 302 can surround or encapsulate the mountable integrated circuit 378, the device adhesive 380 and the mountable device interconnects 382.

It has been discovered that the present invention provides the integrated circuit packaging system 300, with the base conductive vias 336, having increased through connection within and between packaged devices. The base conductive vias 336 can enable manufacture of through interconnects having finer pitch, thus improving through connection within and between packaged devices, such as connection through the base encapsulation 330 to the interposer structure 346 and the mountable device 372.

It has also been discovered that the present invention provides the integrated circuit packaging system 300, with the base conductive vias 336, having reliable connectivity. The base conductive vias 336 having the tapered shape with the base via tip 338 enables precise connection with the base substrate 310 which reduces or eliminates the risk of shorting, providing the integrated circuit packaging system 300 having reliable connectivity.

It has further been discovered that the present invention provides the integrated circuit packaging system 300, with the base conductive vias 336 including the base via head 340, having robust interconnection. The base via head 340 having a width greater than the base via tip 338 provides a wider surface for attaching the interposer interconnects 344 which provide robust interconnection between the base conductive vias 336 and the interposer interconnects 344 of the integrated circuit packaging system 300.

It has further been discovered that the present invention provides the integrated circuit packaging system 300 with the base conductive vias 336 and the interposer interconnects 344 improves throughput. The base conductive vias 336 connected to the interposer interconnects 344 enable reduced manufacturing time compared to other vertical connections, such as bondwires, when forming electrical connections between structures, components and devices, such as the interposer structure 346 of the integrated circuit packaging system 300.

It has further been discovered the present invention provides the integrated circuit packaging system 300, with the base encapsulation 330 including the base encapsulation thickness 334, having reduced process time. The base encapsulation 330 having the base encapsulation thickness 334 equivalent to the distance between the base substrate first side 312 and the base circuit non-active side 322 reduces the distance and time required for the laser ablation process when forming the base conductive vias 336 of the integrated circuit packaging system 300.

It has further been discovered the present invention provides the integrated circuit packaging system 300, with the base encapsulation 330 including the base encapsulation thickness 334, having a low vertical package profile. The base encapsulation 330 having the base encapsulation thickness 334 equivalent to the distance between the base substrate first side 312 and the base circuit non-active side 322 enables uniform reduction in package height for the base encapsulation 330 and the base integrated circuit 318 providing the integrated circuit packaging system 300 having a low profile.

It has further been discovered the present invention provides the integrated circuit packaging system 300 with the base buffer connectors 342 prevents damage to the base substrate 310 during the via formation process. The base buffer connectors 342 provide a stable buffer which reduces manufacture sensitivity to light intensity variation in laser-ablating and drill tip height control or substrate thickness variation in mechanical drilling, preventing damage to the base substrate 310 of the integrated circuit packaging system 300.

It has further been discovered the present invention provides the integrated circuit packaging system 300 with the base buffer connectors 342 reduces process time. The base buffer connectors 342 reduces process time and reduces cost by eliminating the need for the base conductive vias 336 to extend to the base substrate 310 of the integrated circuit packaging system 300.

It has further been discovered the present invention provides the integrated circuit packaging system 300 with the interposer interconnects 344 improves reliability. The interposer interconnects 344 provide a vertical offset between the base integrated circuit 318 and the interposer structure 346 preventing shorting which improves reliability of the integrated circuit packaging system 300.

It has further been discovered the present invention provides the integrated circuit packaging system 300 with the upper encapsulation 368 having improved structural integrity. The upper encapsulation 368 formed over the peripheral portion of the interposer structure 346 prevents or eliminates the risk of disconnection from the interposer interconnects 344 by securing the interposer structure 346 in place which improves structure integrity of the integrated circuit packaging system 300.

It has further been discovered the present invention provides the integrated circuit packaging system 300 with the interposer structure 346 having increased connectivity. The interposer structure 346 exposed from the upper encapsulation 368 provides increased number of input and output sites for connect to other devices, components, and structures, such as the mountable device 372 of the integrated circuit packaging system 300.

It has further been discovered the present invention provides the integrated circuit packaging system 300, with the base integrated circuit 318 including the base circuit vias 326, having increased connectivity. The base circuit vias 326 increase the number of inputs and outputs through the base integrated circuit 318 for connection to the interposer structure 346 which provides the integrated circuit packaging system 300 having increased connectivity.

Figure 4:
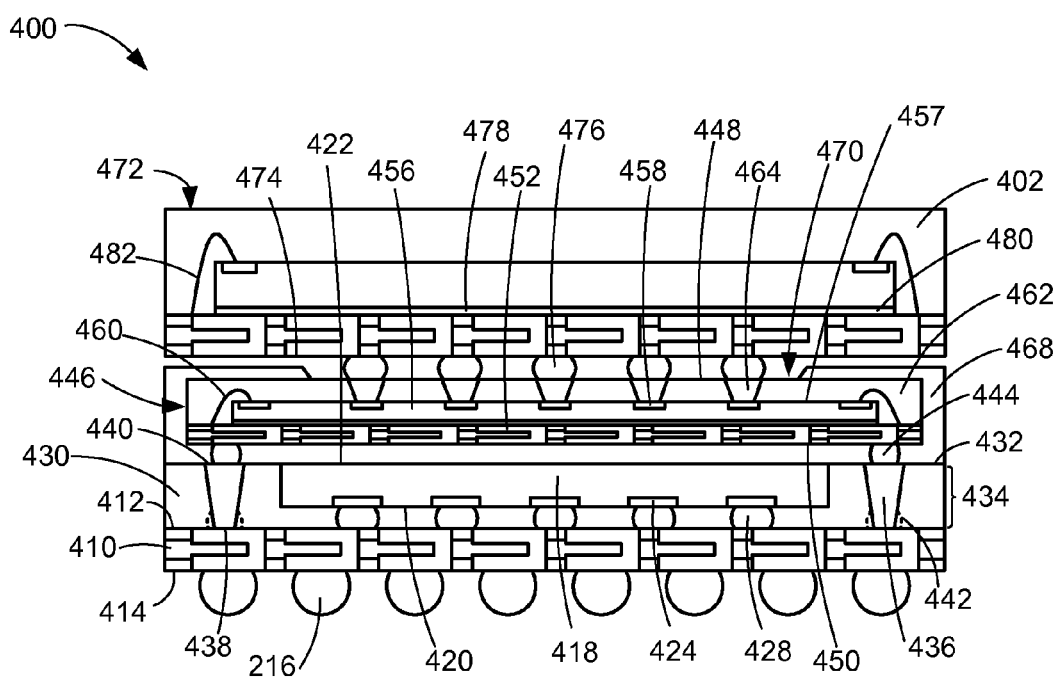
FIG. 4 is a cross-sectional view of an integrated circuit packaging system as exemplified by the line 2-2 of FIG. 1 in a third embodiment of the present invention.

Referring now to FIG. 4, therein is shown a cross-sectional view of an integrated circuit packaging system 400 as exemplified by the line 2-2 of FIG. 1 in a third embodiment of the present invention. The cross-sectional view depicts a base substrate 410. The base substrate 410 is defined as a rigid structure that provides support and connectivity for mounting other components and devices. As an example, the base substrate 410 can be a laminated substrate or a ceramic substrate. As a further example, the laminated substrate can be a layered substrate having vias and intermetallic layers. As a specific example, the base substrate 410 can be a printed circuit board.

The base substrate 410 can have a base substrate first side 412 and a base substrate second side 414. The base substrate first side 412 and the base substrate second side 414 can be the opposing horizontal sides of the base substrate 410 with the base substrate second side 414 facing away from the base substrate first side 412.

External interconnects 416 can be connected to the base substrate second side 414. The external interconnects 416 are defined as conductive connectors that provide connectivity between a packaging system and other devices and components. As an example, the external interconnects 416 solder balls, solder bumps, conductive pillars, or conductive bumps. The external interconnects 416 can connect the integrated circuit packaging system 400 to a next system level down (not shown).

A base integrated circuit 418 can be attached to the base substrate first side 412. The base integrated circuit 418 is defined as an active device having active circuitry fabricated thereon. As an example, the base integrated circuit 418 can be a semiconductor die, a thin semiconductor die, a wirebond die, or a flip chip.

The base integrated circuit 418 can have a base circuit active side 420 and a base circuit non-active side 422. The base circuit active side 420 is defined as the side of the base integrated circuit 418 having active circuitry fabricated thereon (not shown). The base circuit active side 420 can face the base substrate first side 412. The base circuit active side 420 can be parallel with the base circuit active side 420.

The base circuit non-active side 422 is defined as the side of the base integrated circuit 418 opposite the base circuit active side 420. The base circuit non-active side 422 can face away from the base substrate first side 412. The base circuit non-active side 422 can be parallel with the base circuit active side 420.

The base integrated circuit 418 can include base circuit pads 424. The base circuit pads 424 are defined as conductive pads that provide electrical connectivity for an integrated circuit from connective devices or structures. The base circuit pads 424 can be along the base circuit active side 420.

Circuit interconnects 428 can connect the base integrated circuit 418 to the base substrate 410. The circuit interconnects 428 are defined as conductive structures for providing electrical connection between elements, devices, and other structures. As an example, the circuit interconnects 428 solder balls, solder bumps, conductive pillars, or conductive bumps. The circuit interconnects 428 can be attached to the base circuit pads 424. The circuit interconnects 428 can be connected between the base circuit active side 420 and the base substrate first side 412.

A base encapsulation 430 can be on and cover the base substrate first side 412. The base encapsulation 430 is defined as a protective cover that has electric and environmental insulating properties providing a hermetic seal. As an example, the base encapsulation 430 can be a molded encapsulation material, such as epoxy molding compound or ceramic material.

The base encapsulation 430 can be around a portion of the base integrated circuit 418. The base encapsulation 430 can cover the base circuit active side 420 and the vertical sides of the base integrated circuit 418. The base encapsulation 430 can fill the space between the base integrated circuit 418 and the base substrate 410. The base encapsulation 430 can surround or encapsulate the circuit interconnects 428.

The base encapsulation 430 can include a base encapsulation top side 432. The base encapsulation top side 432 is defined as the horizontal surface facing away from the base substrate 410. The base encapsulation top side 432 can be parallel with the base substrate first side 412. The base circuit non-active side 422 can be exposed along and coplanar with the base encapsulation top side 432.

The base encapsulation 430 can have a base encapsulation thickness 434. The base encapsulation thickness 434 is defined as the vertical thickness between the base substrate first side 412 and the base encapsulation top side 432. The base encapsulation thickness 434 can be equivalent to the distance between the base substrate first side 412 and the base circuit non-active side 422.

Base conductive vias 436 can be in and surrounded by the base encapsulation 430. The base conductive vias 436 are defined as conductive structures in a protective cover that provide electrical connectivity and extend between a side of a substrate and a surface of the protective cover. The base conductive vias 436 can be adjacent to the vertical sides of the base integrated circuit 418.

The base conductive vias 436 can extend vertically through the base encapsulation 430. The base conductive vias 436 can be attached to the base substrate 410 at one end of the base conductive vias 436 and exposed from the base encapsulation 430 at the opposing end of the base conductive vias 436.

The base conductive vias 436 can be a conductive structure formed from filling a hole or via (not shown) in the base encapsulation 430 with conductive material. As an example, the base conductive vias 436 can be made from conductive material, such as a copper alloy, gold, a gold alloy, nickel, a nickel alloy, or other alloys. The hole or via in the base encapsulation 430 can be formed by a laser ablation process. The hole or via can be formed to extend from the base encapsulation top side 432 to the base substrate first side 412.

Optionally, base buffer connectors 442, as depicted by the curved dashed lines, can be on the base substrate 410. The base buffer connectors 442 are defined as a physical buffer having electrically conductive properties that protects a substrate from damage during a laser drilling or ablation process. As an example, the base buffer connectors 442 prevent damage to the base substrate 410 during formation of the holes or vias for the base conductive vias 436 by functioning as a physical barrier for the base substrate 410.

The base buffer connectors 442 can be between the base substrate first side 412 and the base conductive vias 436. The base conductive vias 436 can be formed into the base buffer connectors 442.

The base conductive vias 436 can have a base via tip 438 and a base via head 440. The base via head 440 can be the portion of the base via tip 438 that is attached to the base substrate first side 412. The base via head 440 can be electrically connected to pads along the base substrate first side 412.

The base via head 440 is defined as the end of the base conductive vias 436 for providing connectivity to devices or structures stacked on the base conductive vias 436. The base via head 440 can be the portion of the base conductive vias 436 at end of the base conductive vias 436 opposite the base via tip 438. The base via head 440 can be exposed from the base encapsulation 430 along the base encapsulation top side 432. The base via head 440 can be coplanar with the base encapsulation top side 432.

The base conductive vias 436 can have a tapered shape. A tapered shape is defined as a shape having a narrowing width with one end having a greater width than an opposing end. For example, the base via head 440 can have a greater width than the base via tip 438.

Interposer interconnects 444 can be attached to the base via head 440. The interposer interconnects 444 are defined as conductive structures that provide electrical connection between elements, devices, and other structures. As an example, the interposer interconnects 444 solder balls, solder bumps, conductive pillars, or conductive bumps. The interposer interconnects 444 can be attached to the base via head 440.

An interposer structure 446 can be mounted over the base encapsulation 430 and the base integrated circuit 418. The interposer structure 446 is defined as a partially encapsulated rigid structure that provides a surface connecting and mounting additional devices to a packaged device. As an example, the interposer structure 446 can be a partially encapsulated substrate or a partially encapsulated packaged semiconductor stacking module having sites for external electrical connection.

The interposer structure 446 can have an interposer first side 448 and an interposer second side 450. The interposer first side 448 is defined as the horizontal side of the interposer structure 446 facing away from the base encapsulation 430. The interposer second side 450 is defined as the horizontal side of the interposer structure 446 opposite the interposer first side 448. The interposer second side 450 can face the base encapsulation 430.

The interposer structure 446 can be attached to the base conductive vias 436 with the interposer interconnects 444. The interposer interconnects 444 can provide a vertical offset between the interposer structure 446 and the base encapsulation 430, the base integrated circuit 418, or a combination thereof. The interposer interconnects 444 can be attached to the interposer second side 450.

The interposer structure 446 can include an interposer substrate 452. The interposer substrate 452 is defined as a rigid structure that provides support and connectivity for mounting other components and devices. As an example, the interposer substrate 452 can be a laminated substrate or a ceramic substrate. As a further example, the laminated substrate can be a layered substrate having vias and intermetallic layers. As a specific example, the interposer substrate 452 can be a printed circuit board.

The side of the interposer substrate 452 facing the base encapsulation 430 can be the interposer second side 450. The side of the interposer substrate 452 facing the base encapsulation 430 can be attached to the base via head 440 of the base conductive vias 436 with the interposer interconnects 444.

The interposer structure 446 can include an interposer circuit device 456. The interposer circuit device 456 is defined as an active device having active circuitry fabricated thereon. As an example, the interposer circuit device 456 can be a semiconductor die, a wirebond die, a think semiconductor die, or a flip chip. The interposer circuit device 456 can be mounted on side of the interposer substrate 452 facing away from the base encapsulation 430.

The interposer circuit device 456 can have an interposer circuit active side 457. The interposer circuit active side 457 is defined as the horizontal side of the interposer circuit device 456 having active circuitry fabricated thereon (not shown). The interposer circuit active side 457 can face away from the interposer substrate 452.

Interposer circuit pads 458 can be along the interposer circuit active side 457. The interposer circuit pads 458 are defined as conductive pads that provide electrical connectivity for an integrated circuit from connective devices or structures.

The interposer circuit device 456 can be electrically connected to the interposer substrate 452 with interposer device interconnects 460. The interposer device interconnects 460 are defined as a conductive structures for providing electrical connection between elements, devices, and other structures.

For example, the interposer device interconnects 460 can be a bond wire or a ribbon bond wire.

An interposer encapsulation 462 can be on the side of the interposer substrate 452 facing away from the base encapsulation 430. The interposer encapsulation 462 can surround or encapsulate the interposer device interconnects 460 and the interposer circuit device 456. The side of the interposer encapsulation 462 facing away from the interposer substrate 452 can be the interposer first side 448.

Interposer device vias 464 can be in and surrounded by the interposer encapsulation 462. The interposer device vias 464 are defined as conductive structures in a protective cover that provide electrical connectivity and extend between a side of a semiconductor device and a surface of the protective cover.

The interposer device vias 464 can extend vertically through the base encapsulation 430. The interposer device vias 464 can be attached to the interposer circuit pads 458 at one end of the interposer device vias 464 and exposed from the interposer encapsulation 462 at the opposing end of the interposer device vias 464. The interposer device vias 464 can be formed by a process similar to that of used to form the base conductive vias 436.

An upper encapsulation 468 can be over the base encapsulation 430. The upper encapsulation 468 is defined as a protective cover that has electric and environmental insulating properties providing a hermetic seal. As an example, the upper encapsulation 468 can be a molded encapsulation material, such as epoxy molding compound or ceramic material.

The interface between the base encapsulation 430 and the upper encapsulation 468 can be along a single horizontal plane at the base encapsulation top side 432. The vertical sides of the upper encapsulation 468 can be coplanar with the vertical sides of the base encapsulation 430.

The upper encapsulation 468 can be on and entirely cover the base encapsulation top side 432. The upper encapsulation 468 can fill the space between the interposer structure 446 and the base encapsulation top side 432. The upper encapsulation 468 can surround or encapsulate the interposer interconnects 444.

The upper encapsulation 468 can be on and cover the base circuit non-active side 422. The upper encapsulation 468 can fill the space between the interposer structure 446 and the base circuit non-active side 422.

The interposer structure 446 can be partially surrounded by the upper encapsulation 468. The upper encapsulation 468 can cover the vertical sides of the interposer structure 446. The interposer first side 448 of the interposer structure 446 can be exposed from the upper encapsulation 468. The interposer structure 446 can be exposed in a recess 470 in the side of the upper encapsulation 468 facing away from the base encapsulation 430. More specifically, the interposer encapsulation 462 and the interposer device vias 464 can be exposed in the recess 470.

The upper encapsulation 468 can be on a peripheral portion of the interposer first side 448. The peripheral portion is defined as the portions along the perimeter of a horizontal surface.

The integrated circuit packaging system 400 can include a mountable device 472. The mountable device 472 is defined as a packaged integrated circuit device. The mountable device 472 can be over the interposer substrate 452 of the interposer structure 446.

The mountable device 472 can be attached to the portion of the interposer structure 446 exposed from the upper encapsulation 468. The mountable device 472 attached to the interposer structure 446 can form an integrated circuit package-on-package system.

The mountable device 472 can include a device substrate 474. The device substrate 474 is defined as a rigid structure that provides support and connectivity for mounting other components and devices. As an example, the device substrate 474 can be a laminated substrate or a ceramic substrate. As a further example, the laminated substrate can be a layered substrate having vias and intermetallic layers. As a specific example, the device substrate 474 can be a printed circuit board.

The device substrate 474 of the mountable device 472 can be connected to the interposer structure 446 with a mountable interconnects 476. The mountable interconnects 476 is defined as conductive structures for providing electrical connection between elements, devices, and other structures. As an example, the mountable interconnects 476 solder balls, solder bumps, conductive pillars, or conductive bumps. As a further example, the mountable interconnects 476 can be attached between the interposer device vias 464 of the interposer structure 446 and the device substrate 474.

A mountable integrated circuit 478 can be mounted on the device substrate 474. The mountable integrated circuit 478 is defined as an active device having active circuitry fabricated thereon (not shown). As an example, the mountable integrated circuit 478 can be a semiconductor die, a wirebond die, a think semiconductor die, or a flip chip.

The mountable integrated circuit 478 can be attached to the device substrate 474 with a device adhesive 480. The device adhesive 480 is defined as a material for physically bonding or adhering two or more components to each other. For example, the device adhesive 480 can be an epoxy or polymer adhesive, a b-stage or partially cured adhesive material, or a thermally conductive adhesive material. The device adhesive 480 can be between the device substrate 474 and the side of the mountable integrated circuit 478 facing the device substrate 474.

The mountable integrated circuit 478 can be connected to the device substrate 474 with mountable device interconnects 482. The mountable device interconnects 482 is defined as a conductive structures for providing electrical connection between elements, devices, and other structures. For example, the mountable device interconnects 482 can be a bond wire or a ribbon bond wire.

The mountable device interconnects 482 can connect between the device substrate 474 and the side of the mountable integrated circuit 478 having the active circuitry. The mountable device interconnects 482 can provide electrical connectivity between the mountable integrated circuit 478 and the device substrate 474.

The mountable device 472 can include a mountable device encapsulation 402. The mountable device encapsulation 402 is defined as a protective cover that has electric and environmental insulating properties providing a hermetic seal. As an example, the mountable device encapsulation 402 can be a molded encapsulation material, such as epoxy molding compound or ceramic material.

The mountable device encapsulation 402 can be on the side of the device substrate 474 facing away from the interposer encapsulation 462. The mountable device encapsulation 402 can surround or encapsulate the mountable integrated circuit 478, the device adhesive 480 and the mountable device interconnects 482.

It has been discovered that the present invention provides the integrated circuit packaging system 400, with the base conductive vias 436, having increased through connection within and between packaged devices. The base conductive vias 436 can enable manufacture of through interconnects having finer pitch, thus improving through connection within and between packaged devices, such as connection through the base encapsulation 430 to the interposer structure 446 and the mountable device 472.

It has also been discovered that the present invention provides the integrated circuit packaging system 400, with the base conductive vias 436, having reliable connectivity. The base conductive vias 436 having the tapered shape with the base via tip 438 enables precise connection with the base substrate 410 which reduces or eliminates the risk of shorting, providing the integrated circuit packaging system 400 having reliable connectivity.

It has further been discovered that the present invention provides the integrated circuit packaging system 400, with the base conductive vias 436 including the base via head 440, having robust interconnection. The base via head 440 having a width greater than the base via tip 438 provides a wider surface for attaching the interposer interconnects 444 which provide robust interconnection between the base conductive vias 436 and the interposer interconnects 444 of the integrated circuit packaging system 400.

It has further been discovered that the present invention provides the integrated circuit packaging system 400 with the base conductive vias 436 and the interposer interconnects 444 improves throughput. The base conductive vias 436 connected to the interposer interconnects 444 enable reduced manufacturing time compared to other vertical connections, such as bondwires, when forming electrical connections between structures, components and devices, such as the interposer structure 446 of the integrated circuit packaging system 400.

It has further been discovered the present invention provides the integrated circuit packaging system 400, with the base encapsulation 430 including the base encapsulation thickness 434, having reduced process time. The base encapsulation 430 having the base encapsulation thickness 434 equivalent to the distance between the base substrate first side 412 and the base circuit non-active side 422 reduces the distance and time required for the laser ablation process when forming the base conductive vias 436 of the integrated circuit packaging system 400.

It has further been discovered the present invention provides the integrated circuit packaging system 400, with the base encapsulation 430 including the base encapsulation thickness 434, having a low vertical package profile. The base encapsulation 430 having the base encapsulation thickness 434 equivalent to the distance between the base substrate first side 412 and the base circuit non-active side 422 enables uniform reduction in package height for the base encapsulation 430 and the base integrated circuit 418 providing the integrated circuit packaging system 400 having a low profile.

It has further been discovered the present invention provides the integrated circuit packaging system 400 with the base buffer connectors 442 prevents damage to the base substrate 410 during the via formation process. The base buffer connectors 442 provide a stable buffer which reduces manufacture sensitivity to light intensity variation in laser-ablating and drill tip height control or substrate thickness variation in mechanical drilling, preventing damage to the base substrate 410 of the integrated circuit packaging system 400.

It has further been discovered the present invention provides the integrated circuit packaging system 400 with the base buffer connectors 442 reduces process time. The base buffer connectors 442 reduces process time and reduces cost by eliminating the need for the base conductive vias 436 to extend to the base substrate 410 of the integrated circuit packaging system 400.

It has further been discovered the present invention provides the integrated circuit packaging system 400 with the interposer interconnects 444 improves reliability. The interposer interconnects 444 provide a vertical offset between the base integrated circuit 418 and the interposer structure 446 preventing shorting which improves reliability of the integrated circuit packaging system 400.

It has further been discovered the present invention provides the integrated circuit packaging system 400 with the upper encapsulation 468 having improved structural integrity. The upper encapsulation 468 formed over the peripheral portion of the interposer structure 446 prevents or eliminates the risk of disconnection from the interposer interconnects 444 by securing the interposer structure 446 in place which improves structure integrity of the integrated circuit packaging system 400.

It has further been discovered the present invention provides the integrated circuit packaging system 400 with the interposer structure 446 having increased connectivity. The interposer structure 446 exposed from the upper encapsulation 468 provides increased number of input and output sites for connect to other devices, components, and structures, such as the mountable device 472 of the integrated circuit packaging system 400.

It has further been discovered the present invention provides the integrated circuit packaging system 400, with the interposer structure 446 including the interposer circuit device 456, having increased packaging density. The interposer structure 446 having the interposer circuit device 456 increases the number of devices with active circuitry in the integrated circuit packaging system 400 providing an increase in packaging density.

It has further been discovered the present invention provides the integrated circuit packaging system 400 with the interposer device vias 464 provide increased connectivity. The interposer device vias 464 provide increased number of input and output sites for connect to other devices, components, and structures, such as the mountable device 472 of the integrated circuit packaging system 400.

Figure 5:
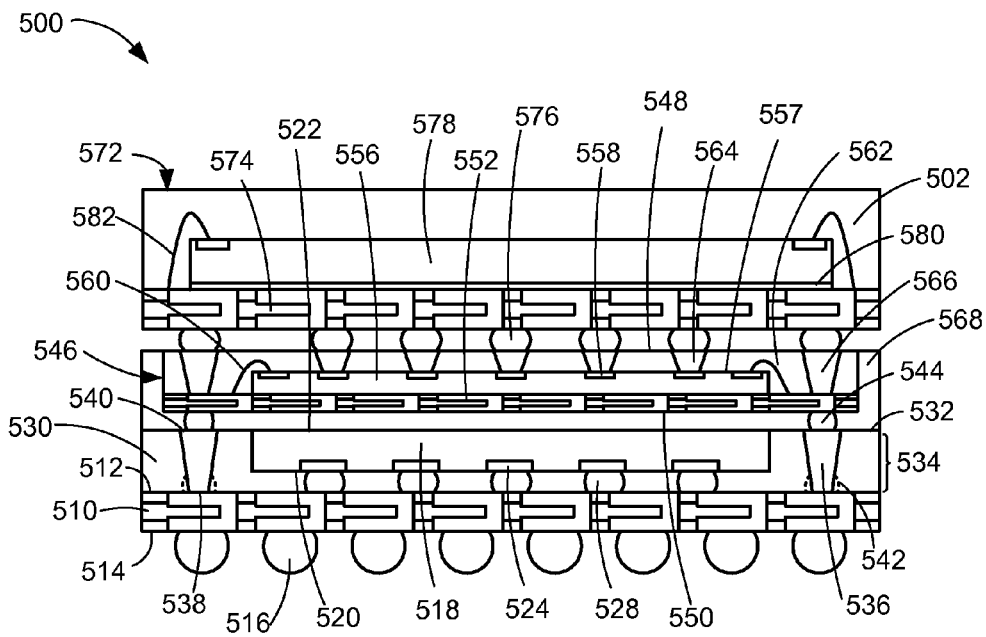
FIG. 5 is a cross-sectional view of an integrated circuit packaging system as exemplified by the line 2-2 of FIG. 1 in a fourth embodiment of the present invention.

Referring now to FIG. 5, therein is shown a cross-sectional view of an integrated circuit packaging system 500 as exemplified by the line 2-2 of FIG. 1 in a fourth embodiment of the present invention. The cross-sectional view depicts a base substrate 510. The base substrate 510 is defined as a rigid structure that provides support and connectivity for mounting other components and devices. As an example, the base substrate 510 can be a laminated substrate or a ceramic substrate. As a further example, the laminated substrate can be a layered substrate having vias and intermetallic layers. As a specific example, the base substrate 510 can be a printed circuit board.

The base substrate 510 can have a base substrate first side 512 and a base substrate second side 514. The base substrate first side 512 and the base substrate second side 514 can be the opposing horizontal sides of the base substrate 510 with the base substrate second side 514 facing away from the base substrate first side 512.

External interconnects 516 can be connected to the base substrate second side 514. The external interconnects 516 are defined as conductive connectors that provide connectivity between a packaging system and other devices and components. As an example, the external interconnects 516 solder balls, solder bumps, conductive pillars, or conductive bumps.

The external interconnects 516 can connect the integrated circuit packaging system 500 to a next system level down (not shown).

A base integrated circuit 518 can be attached to the base substrate first side 512. The base integrated circuit 518 is defined as an active device having active circuitry fabricated thereon. As an example, the base integrated circuit 518 can be a semiconductor die, a thin semiconductor die, a wirebond die, or a flip chip.

The base integrated circuit 518 can have a base circuit active side 520 and a base circuit non-active side 522. The base circuit active side 520 is defined as the side of the base integrated circuit 518 having active circuitry fabricated thereon (not shown). The base circuit active side 520 can face the base substrate first side 512. The base circuit active side 520 can be parallel with the base circuit active side 520.

The base circuit non-active side 522 is defined as the side of the base integrated circuit 518 opposite the base circuit active side 520. The base circuit non-active side 522 can face away from the base substrate first side 512. The base circuit non-active side 522 can be parallel with the base circuit active side 520.

The base integrated circuit 518 can include base circuit pads 524. The base circuit pads 524 are defined as conductive pads that provide electrical connectivity for an integrated circuit from connective devices or structures. The base circuit pads 524 can be along the base circuit active side 520.

Circuit interconnects 528 can connect the base integrated circuit 518 to the base substrate 510. The circuit interconnects 528 are defined as conductive structures for providing electrical connection between elements, devices, and other structures. As an example, the circuit interconnects 528 solder balls, solder bumps, conductive pillars, or conductive bumps. The circuit interconnects 528 can be attached to the base circuit pads 524. The circuit interconnects 528 can be connected between the base circuit active side 520 and the base substrate first side 512.

A base encapsulation 530 can be on and cover the base substrate first side 512. The base encapsulation 530 is defined as a protective cover that has electric and environmental insulating properties providing a hermetic seal. As an example, the base encapsulation 530 can be a molded encapsulation material, such as epoxy molding compound or ceramic material.

The base encapsulation 530 can be around a portion of the base integrated circuit 518. The base encapsulation 530 can cover the base circuit active side 520 and the vertical sides of the base integrated circuit 518. The base encapsulation 530 can fill the space between the base integrated circuit 518 and the base substrate 510. The base encapsulation 530 can surround or encapsulate the circuit interconnects 528.

The base encapsulation 530 can include a base encapsulation top side 532. The base encapsulation top side 532 is defined as the horizontal surface facing away from the base substrate 510. The base encapsulation top side 532 can be parallel with the base substrate first side 512. The base circuit non-active side 522 can be exposed along and coplanar with the base encapsulation top side 532.

The base encapsulation 530 can have a base encapsulation thickness 534. The base encapsulation thickness 534 is defined as the vertical thickness between the base substrate first side 512 and the base encapsulation top side 532. The base encapsulation thickness 534 can be equivalent to the distance between the base substrate first side 512 and the base circuit non-active side 522.

Base conductive vias 536 can be in and surrounded by the base encapsulation 530. The base conductive vias 536 are defined as conductive structures in a protective cover that provide electrical connectivity and extend between a side of a substrate and a surface of the protective cover. The base conductive vias 536 can be adjacent to the vertical sides of the base integrated circuit 518.

The base conductive vias 536 can extend vertically through the base encapsulation 530. The base conductive vias 536 can be attached to the base substrate 510 at one end of the base conductive vias 536 and exposed from the base encapsulation 530 at the opposing end of the base conductive vias 536.

The base conductive vias 536 can be a conductive structure formed from filling a hole or via (not shown) in the base encapsulation 530 with conductive material. As an example, the base conductive vias 536 can be made from conductive material, such as a copper alloy, gold, a gold alloy, nickel, a nickel alloy, or other alloys. The hole or via in the base encapsulation 530 can be formed by a laser ablation process. The hole or via can be formed to extend from the base encapsulation top side 532 to the base substrate first side 512.

Optionally, base buffer connectors 542, as depicted by the curved dashed lines, can be on the base substrate 510. The base buffer connectors 542 are defined as a physical buffer having electrically conductive properties that protects a substrate from damage during a laser drilling or ablation process. As an example, the base buffer connectors 542 prevent damage to the base substrate 510 during formation of the holes or vias for the base conductive vias 536 by functioning as a physical barrier for the base substrate 510.

The base buffer connectors 542 can be between the base substrate first side 512 and the base conductive vias 536. The base conductive vias 536 can be formed into the base buffer connectors 542.

The base conductive vias 536 can have a base via tip 538 and a base via head 540. The base via head 540 can be the portion of the base via tip 538 that is attached to the base substrate first side 512. The base via head 540 can be electrically connected to pads along the base substrate first side 512.

The base via head 540 is defined as the end of the base conductive vias 536 for providing connectivity to devices or structures stacked on the base conductive vias 536. The base via head 540 can be the portion of the base conductive vias 536 at end of the base conductive vias 536 opposite the base via tip 538. The base via head 540 can be exposed from the base encapsulation 530 along the base encapsulation top side 532. The base via head 540 can be coplanar with the base encapsulation top side 532.

The base conductive vias 536 can have a tapered shape. A tapered shape is defined as a shape having a narrowing width with one end having a greater width than an opposing end. For example, the base via head 540 can have a greater width than the base via tip 538.

Interposer interconnects 544 can be attached to the base via head 540. The interposer interconnects 544 are defined as conductive structures that provide electrical connection between elements, devices, and other structures. As an example, the interposer interconnects 544 solder balls, solder bumps, conductive pillars, or conductive bumps. The interposer interconnects 544 can be attached to the base via head 540.

An interposer structure 546 can be mounted over the base encapsulation 530 and the base integrated circuit 518. The interposer structure 546 is defined as a partially encapsulated rigid structure that provides a surface connecting and mounting additional devices to a packaged device. As an example, the interposer structure 546 can be a partially encapsulated substrate or a partially encapsulated packaged semiconductor stacking module having sites for external electrical connection.

The interposer structure 546 can have an interposer first side 548 and an interposer second side 550. The interposer first side 548 is defined as the horizontal side of the interposer structure 546 facing away from the base encapsulation 530. The interposer second side 550 is defined as the horizontal side of the interposer structure 546 opposite the interposer first side 548. The interposer second side 550 can face the base encapsulation 530.

The interposer structure 546 can be attached to the base conductive vias 536 with the interposer interconnects 544. The interposer interconnects 544 can provide a vertical offset between the interposer structure 546 and the base encapsulation 530, the base integrated circuit 518, or a combination thereof. The interposer interconnects 544 can be attached to the interposer second side 550.

The interposer structure 546 can include an interposer substrate 552. The interposer substrate 552 is defined as a rigid structure that provides support and connectivity for mounting other components and devices. As an example, the interposer substrate 552 can be a laminated substrate or a ceramic substrate. As a further example, the laminated substrate can be a layered substrate having vias and intermetallic layers. As a specific example, the interposer substrate 552 can be a printed circuit board.

The side of the interposer substrate 552 facing the base encapsulation 530 can be the interposer second side 550. The side of the interposer substrate 552 facing the base encapsulation 530 can be attached to the base via head 540 of the base conductive vias 536 with the interposer interconnects 544.

The interposer structure 546 can include an interposer circuit device 556. The interposer circuit device 556 is defined as an active device having active circuitry fabricated thereon. As an example, the interposer circuit device 556 can be a semiconductor die, a wirebond die, a think semiconductor die, or a flip chip. The interposer circuit device 556 can be mounted on side of the interposer substrate 552 facing away from the base encapsulation 530.

The interposer circuit device 556 can have an interposer circuit active side 557. The interposer circuit active side 557 is defined as the horizontal side of the interposer circuit device 556 having active circuitry fabricated thereon (not shown). The interposer circuit active side 557 can face away from the interposer substrate 552.

Interposer circuit pads 558 can be along the interposer circuit active side 557. The interposer circuit pads 558 are defined as conductive pads that provide electrical connectivity for an integrated circuit from connective devices or structures.

The interposer circuit device 556 can be electrically connected to the interposer substrate 552 with interposer device interconnects 560. The interposer device interconnects 560 are defined as a conductive structures for providing electrical connection between elements, devices, and other structures. For example, the interposer device interconnects 560 can be a bond wire or a ribbon bond wire.

An interposer encapsulation 562 can be on the side of the interposer substrate 552 facing away from the base encapsulation 530. The interposer encapsulation 562 can surround or encapsulate the interposer device interconnects 560 and the interposer circuit device 556. The surface of the interposer encapsulation 562 facing away from the interposer substrate 552 can be the interposer first side 548.

Interposer device vias 564 can be in and surrounded by interposer encapsulation 562. The interposer device vias 564 are defined as conductive structures in a protective cover that provide electrical connectivity and extend between a side of a semiconductor device and a surface of the protective cover.

The interposer device vias 564 can extend vertically through the base encapsulation 530. The interposer device vias 564 can be attached to the interposer circuit pads 558 at one end of the interposer device vias 564 and exposed from the interposer encapsulation 562 at the opposing end of the interposer device vias 564. The interposer device vias 564 can be formed by a process similar to that of used to form the base conductive vias 536.

Interposer substrate vias 566 can be in and surrounded by the interposer encapsulation 562. The interposer substrate vias 566 are defined as conductive structures in a protective cover that provide electrical connectivity and extend between a side of a substrate and a surface of the protective cover. The interposer substrate vias 566 can be adjacent to the vertical side of the interposer circuit device 556.

The interposer substrate vias 566 can extend vertically through the base encapsulation 530. The interposer substrate vias 566 can be attached to the side of the interposer substrate 552 facing away from the base encapsulation 530 at one end of the interposer substrate vias 566 and exposed from the interposer encapsulation 562 at the opposing end of the interposer substrate vias 566. The interposer device vias 564 can be formed by a process similar to that of used to form the base conductive vias 536.

An upper encapsulation 568 can be over the base encapsulation 530. The upper encapsulation 568 is defined as a protective cover that has electric and environmental insulating properties providing a hermetic seal. As an example, the upper encapsulation 568 can be a molded encapsulation material, such as epoxy molding compound or ceramic material.

The interface between the base encapsulation 530 and the upper encapsulation 568 can be along a single horizontal plane at the base encapsulation top side 532. The vertical sides of the upper encapsulation 568 can be coplanar with the vertical sides of the base encapsulation 530.

The upper encapsulation 568 can be on and entirely cover the base encapsulation top side 532. The upper encapsulation 568 can fill the space between the interposer structure 546 and the base encapsulation top side 532. The upper encapsulation 568 can surround or encapsulate the interposer interconnects 544.

The upper encapsulation 568 can be on and cover the base circuit non-active side 522. The upper encapsulation 568 can fill the space between the interposer structure 546 and the base circuit non-active side 522.

The interposer structure 546 can be partially surrounded by the upper encapsulation 568. The upper encapsulation 568 can cover the vertical sides of the interposer structure 546. The interposer first side 548 of the interposer structure 546 can be exposed from the upper encapsulation 568. The upper encapsulation 568 can be on a coplanar with the interposer first side 548.

The integrated circuit packaging system 500 can include a mountable device 572. The mountable device 572 is defined as a packaged integrated circuit device. The mountable device 572 can be over the interposer substrate 552 of the interposer structure 546.

The mountable device 572 can be attached to the portion of the interposer structure 546 exposed from the upper encapsulation 568. The mountable device 572 attached to the interposer structure 546 can form an integrated circuit package-on-package system.

The mountable device 572 can include a device substrate 574. The device substrate 574 is defined as a rigid structure that provides support and connectivity for mounting other components and devices. As an example, the device substrate 574 can be a laminated substrate or a ceramic substrate. As a further example, the laminated substrate can be a layered substrate having vias and intermetallic layers. As a specific example, the device substrate 574 can be a printed circuit board.

The device substrate 574 of the mountable device 572 can be connected to the interposer structure 546 with a mountable interconnects 576. The mountable interconnects 576 is defined as conductive structures for providing electrical connection between elements, devices, and other structures. As an example, the mountable interconnects 576 solder balls, solder bumps, conductive pillars, or conductive bumps. As a further example, the mountable interconnects 576 can be attached between the interposer device vias 564 and the interposer substrate vias 566 of the interposer structure 546 and the device substrate 574.

A mountable integrated circuit 578 can be mounted on the device substrate 574. The mountable integrated circuit 578 is defined as an active device having active circuitry fabricated thereon (not shown). As an example, the mountable integrated circuit 578 can be a semiconductor die, a wirebond die, a think semiconductor die, or a flip chip.

The mountable integrated circuit 578 can be attached to the device substrate 574 with a device adhesive 580. The device adhesive 580 is defined as a material for physically bonding or adhering two or more components to each other. For example, the device adhesive 580 can be an epoxy or polymer adhesive, a b-stage or partially cured adhesive material, or a thermally conductive adhesive material. The device adhesive 580 can be between the device substrate 574 and the side of the mountable integrated circuit 578 facing the device substrate 574.

The mountable integrated circuit 578 can be connected to the device substrate 574 with mountable device interconnects 582. The mountable device interconnects 582 is defined as a conductive structures for providing electrical connection between elements, devices, and other structures. For example, the mountable device interconnects 582 can be a bond wire or a ribbon bond wire.

The mountable device interconnects 582 can connect between the device substrate 574 and the side of the mountable integrated circuit 578 having the active circuitry. The mountable device interconnects 582 can provide electrical connectivity between the mountable integrated circuit 578 and the device substrate 574.

The mountable device 572 can include a mountable device encapsulation 502. The mountable device encapsulation 502 is defined as a protective cover that has electric and environmental insulating properties providing a hermetic seal. As an example, the mountable device encapsulation 502 can be a molded encapsulation material, such as epoxy molding compound or ceramic material.

The mountable device encapsulation 502 can be on the side of the device substrate 574 facing away from the interposer encapsulation 562. The mountable device encapsulation 502 can surround or encapsulate the mountable integrated circuit 578, the device adhesive 580 and the mountable device interconnects 582.

It has been discovered that the present invention provides the integrated circuit packaging system 500, with the base conductive vias 536, having increased through connection within and between packaged devices. The base conductive vias 536 can enable manufacture of through interconnects having finer pitch, thus improving through connection within and between packaged devices, such as connection through the base encapsulation 530 to the interposer structure 546 and the mountable device 572.

It has also been discovered that the present invention provides the integrated circuit packaging system 500, with the base conductive vias 536, having reliable connectivity. The base conductive vias 536 having the tapered shape with the base via tip 538 enables precise connection with the base substrate 510 which reduces or eliminates the risk of shorting, providing the integrated circuit packaging system 500 having reliable connectivity.

It has further been discovered that the present invention provides the integrated circuit packaging system 500, with the base conductive vias 536 including the base via head 540, having robust interconnection. The base via head 540 having a width greater than the base via tip 538 provides a wider surface for attaching the interposer interconnects 544 which provide robust interconnection between the base conductive vias 536 and the interposer interconnects 544 of the integrated circuit packaging system 500.

It has further been discovered that the present invention provides the integrated circuit packaging system 500 with the base conductive vias 536 and the interposer interconnects 544 improves throughput. The base conductive vias 536 connected to the interposer interconnects 544 enable reduced manufacturing time compared to other vertical connections, such as bondwires, when forming electrical connections between structures, components and devices, such as the interposer structure 546 of the integrated circuit packaging system 500.

It has further been discovered the present invention provides the integrated circuit packaging system 500, with the base encapsulation 530 including the base encapsulation thickness 534, having reduced process time. The base encapsulation 530 having the base encapsulation thickness 534 equivalent to the distance between the base substrate first side 512 and the base circuit non-active side 522 reduces the distance and time required for the laser ablation process when forming the base conductive vias 536 of the integrated circuit packaging system 500.

It has further been discovered the present invention provides the integrated circuit packaging system 500 with the base buffer connectors 542 prevents damage to the base substrate 510 during the via formation process. The base buffer connectors 542 provide a stable buffer which reduces manufacture sensitivity to light intensity variation in laser-ablating and drill tip height control or substrate thickness variation in mechanical drilling, preventing damage to the base substrate 510 of the integrated circuit packaging system 500.

It has further been discovered the present invention provides the integrated circuit packaging system 500 with the base buffer connectors 542 reduces process time. The base buffer connectors 542 reduces process time and reduces cost by eliminating the need for the base conductive vias 536 to extend to the base substrate 510 of the integrated circuit packaging system 500.

It has further been discovered the present invention provides the integrated circuit packaging system 500 with the interposer structure 546 having increased connectivity. The interposer structure 546 exposed from the upper encapsulation 568 provides increased number of input and output sites for connect to other devices, components, and structures, such as the mountable device 572 of the integrated circuit packaging system 500.

It has further been discovered the present invention provides the integrated circuit packaging system 500, with the interposer structure 546 including the interposer circuit device 556, having increased packaging density. The interposer structure 546 having the interposer circuit device 556 increases the number of devices with active circuitry in the integrated circuit packaging system 500 providing an increase in packaging density.

It has further been discovered the present invention provides the integrated circuit packaging system 500 with the interposer device vias 564 and the interposer substrate vias 566 provide increased connectivity. The interposer device vias 564 and the interposer substrate vias 566 provide increased number of input and output sites for connect to other devices, components, and structures, such as the mountable device 572 of the integrated circuit packaging system 500.

It has further been discovered the present invention provides the integrated circuit packaging system 500, with the upper encapsulation 568 coplanar with the interposer first side 548, having a low vertical package profile. The side of the upper encapsulation 568 facing away from the base encapsulation 530 coplanar with the interposer first side 548 reduces the overall vertical dimension of the integrated circuit packaging system 500 which provides a low vertical profile.

Figure 6:
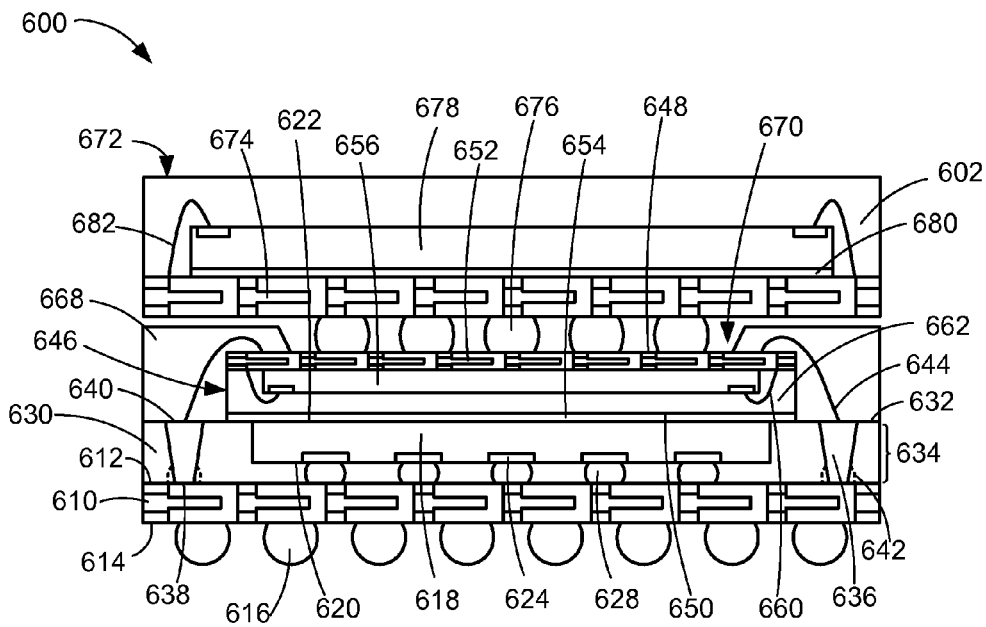
FIG. 6 is a cross-sectional view of an integrated circuit packaging system as exemplified by the line 2-2 of FIG. 1 in a fifth embodiment of the present invention.

Referring now to FIG. 6, therein is shown a cross-sectional view of an integrated circuit packaging system 600 as exemplified by the line 2-2 of FIG. 1 in a fifth embodiment of the present invention. The cross-sectional view depicts a base substrate 610. The base substrate 610 is defined as a rigid structure that provides support and connectivity for mounting other components and devices. As an example, the base substrate 610 can be a laminated substrate or a ceramic substrate. As a further example, the laminated substrate can be a layered substrate having vias and intermetallic layers. As a specific example, the base substrate 610 can be a printed circuit board.

The base substrate 610 can have a base substrate first side 612 and a base substrate second side 614. The base substrate first side 612 and the base substrate second side 614 can be the opposing horizontal sides of the base substrate 610 with the base substrate second side 614 facing away from the base substrate first side 612.

External interconnects 616 can be connected to the base substrate second side 614. The external interconnects 616 are defined as conductive connectors that provide connectivity between a packaging system and other devices and components. As an example, the external interconnects 616 solder balls, solder bumps, conductive pillars, or conductive bumps. The external interconnects 616 can connect the integrated circuit packaging system 600 to a next system level down (not shown).

A base integrated circuit 618 can be attached to the base substrate first side 612. The base integrated circuit 618 is defined as an active device having active circuitry fabricated thereon. As an example, the base integrated circuit 618 can be a semiconductor die, a thin semiconductor die, a wirebond die, or a flip chip.

The base integrated circuit 618 can have a base circuit active side 620 and a base circuit non-active side 622. The base circuit active side 620 is defined as the side of the base integrated circuit 618 having active circuitry fabricated thereon (not shown). The base circuit active side 620 can face the base substrate first side 612. The base circuit active side 620 can be parallel with the base circuit active side 620.

The base circuit non-active side 622 is defined as the side of the base integrated circuit 618 opposite the base circuit active side 620. The base circuit non-active side 622 can face away from the base substrate first side 612. The base circuit non-active side 622 can be parallel with the base circuit active side 620.

The base integrated circuit 618 can include base circuit pads 624. The base circuit pads 624 are defined as conductive pads that provide electrical connectivity for an integrated circuit from connective devices or structures. The base circuit pads 624 can be along the base circuit active side 620.

Circuit interconnects 628 can connect the base integrated circuit 618 to the base substrate 610. The circuit interconnects 628 are defined as conductive structures for providing electrical connection between elements, devices, and other structures. As an example, the circuit interconnects 628 solder balls, solder bumps, conductive pillars, or conductive bumps. The circuit interconnects 628 can be attached to the base circuit pads 624. The circuit interconnects 628 can be connected between the base circuit active side 620 and the base substrate first side 612.

A base encapsulation 630 can be on and cover the base substrate first side 612. The base encapsulation 630 is defined as a protective cover that has electric and environmental insulating properties providing a hermetic seal. As an example, the base encapsulation 630 can be a molded encapsulation material, such as epoxy molding compound or ceramic material.

The base encapsulation 630 can be around a portion of the base integrated circuit 618. The base encapsulation 630 can cover the base circuit active side 620 and the vertical sides of the base integrated circuit 618. The base encapsulation 630 can fill the space between the base integrated circuit 618 and the base substrate 610. The base encapsulation 630 can surround or encapsulate the circuit interconnects 628.

The base encapsulation 630 can include a base encapsulation top side 632. The base encapsulation top side 632 is defined as the horizontal surface facing away from the base substrate 610. The base encapsulation top side 632 can be parallel with the base substrate first side 612. The base circuit non-active side 622 can be exposed along and coplanar with the base encapsulation top side 632.

The base encapsulation 630 can have a base encapsulation thickness 634. The base encapsulation thickness 634 is defined as the vertical thickness between the base substrate first side 612 and the base encapsulation top side 632. The base encapsulation thickness 634 can be equivalent to the distance between the base substrate first side 612 and the base circuit non-active side 622.

Base conductive vias 636 can be in and surrounded by the base encapsulation 630. The base conductive vias 636 are defined as conductive structures in a protective cover that provide electrical connectivity and extend between a side of a substrate and a surface of the protective cover. The base conductive vias 636 can be adjacent to the vertical sides of the base integrated circuit 618.

The base conductive vias 636 can extend vertically through the base encapsulation 630. The base conductive vias 636 can be attached to the base substrate 610 at one end of the base conductive vias 636 and exposed from the base encapsulation 630 at the opposing end of the base conductive vias 636.

The base conductive vias 636 can be a conductive structure formed from filling a hole or via (not shown) in the base encapsulation 630 with conductive material. As an example, the base conductive vias 636 can be made from conductive material, such as a copper alloy, gold, a gold alloy, nickel, a nickel alloy, or other alloys. The hole or via in the base encapsulation 630 can be formed by a laser ablation process. The hole or via can be formed to extend from the base encapsulation top side 632 to the base substrate first side 612.

Optionally, base buffer connectors 642, as depicted by the curved dashed lines, can be on the base substrate 610. The base buffer connectors 642 are defined as a physical buffer having electrically conductive properties that protects a substrate from damage during a laser drilling or ablation process. As an example, the base buffer connectors 642 prevent damage to the base substrate 610 during formation of the holes or vias for the base conductive vias 636 by functioning as a physical barrier for the base substrate 610.

The base buffer connectors 642 can be between the base substrate first side 612 and the base conductive vias 636. The base conductive vias 636 can be formed into the base buffer connectors 642.

The base conductive vias 636 can have a base via tip 638 and a base via head 640. The base via head 640 can be the portion of the base via tip 638 that is attached to the base substrate first side 612. The base via head 640 can be electrically connected to pads along the base substrate first side 612.

The base via head 640 is defined as the end of the base conductive vias 636 for providing connectivity to devices or structures stacked on the base conductive vias 636. The base via head 640 can be the portion of the base conductive vias 636 at end of the base conductive vias 636 opposite the base via tip 638. The base via head 640 can be exposed from the base encapsulation 630 along the base encapsulation top side 632. The base via head 640 can be coplanar with the base encapsulation top side 632.

The base conductive vias 636 can have a tapered shape. A tapered shape is defined as a shape having a narrowing width with one end having a greater width than an opposing end. For example, the base via head 640 can have a greater width than the base via tip 638.

Interposer interconnects 644 can be attached to the base via head 640. The interposer interconnects 644 are defined as conductive structures that provide electrical connection between elements, devices, and other structures. As an example, the interposer interconnects 644 can bondwires or ribbon bondwires. The interposer interconnects 644 can be attached to the base via head 640.

An interposer structure 646 can be mounted over the base encapsulation 630 and the base integrated circuit 618. The interposer structure 646 is defined as a partially encapsulated rigid structure that provides a surface connecting and mounting additional devices to a packaged device. As an example, the interposer structure 646 can be a partially encapsulated substrate or a partially encapsulated packaged semiconductor stacking module having sites for external electrical connection.

The interposer structure 646 can have an interposer first side 648 and an interposer second side 650. The interposer first side 648 is defined as the horizontal side of the interposer structure 646 facing away from the base encapsulation 630. The interposer second side 650 is defined as the horizontal side of the interposer structure 646 opposite the interposer first side 648. The interposer second side 650 can face the base encapsulation 630.

The interposer structure 646 can be attached to the base encapsulation top side 632 and the base circuit non-active side 622 with an interposer adhesive 654 along the interposer second side 650. The interposer adhesive is defined as a material for physically bonding or adhering two or more components to each other. For example, the interposer adhesive 654 can be an epoxy or polymer adhesive, a b-stage or partially cured adhesive material, or a thermally conductive adhesive material.

The interposer structure 646 can include an interposer substrate 652. The interposer substrate 652 is defined as a rigid structure that provides support and connectivity for mounting other components and devices. As an example, the interposer substrate 652 can be a laminated substrate or a ceramic substrate. As a further example, the laminated substrate can be a layered substrate having vias and intermetallic layers. As a specific example, the interposer substrate 652 can be a printed circuit board.

The side of the interposer substrate 652 facing the base encapsulation 630 can be the interposer first side 648. The interposer interconnects 644 can be attached to the side of the interposer substrate 652 facing away from the base encapsulation 630.

The interposer structure 646 can include an interposer circuit device 656. The interposer circuit device 656 is defined as an active device having active circuitry fabricated thereon. As an example, the interposer circuit device 656 can be a semiconductor die, a wirebond die, a think semiconductor die, or a flip chip. The interposer circuit device 656 can be mounted on side of the interposer substrate 652 facing the base encapsulation 630.

The interposer circuit device 656 can be electrically connected to the interposer substrate 652 with interposer device interconnects 660. The interposer device interconnects 660 are defined as a conductive structures for providing electrical connection between elements, devices, and other structures. For example, the interposer device interconnects 660 can be a bond wire or a ribbon bond wire.

An interposer encapsulation 662 can be on the side of the interposer substrate 652 facing the base encapsulation 630. The interposer encapsulation 662 can surround or encapsulate the interposer device interconnects 660 and the interposer circuit device 656. The surface of the interposer encapsulation 662 facing the base encapsulation 630 can be the interposer second side 650.

An upper encapsulation 668 can be over the base encapsulation 630. The upper encapsulation 668 is defined as a protective cover that has electric and environmental insulating properties providing a hermetic seal. As an example, the upper encapsulation 668 can be a molded encapsulation material, such as epoxy molding compound or ceramic material.

The interface between the base encapsulation 630 and the upper encapsulation 668 can be along a single horizontal plane at the base encapsulation top side 632. The vertical sides of the upper encapsulation 668 can be coplanar with the vertical sides of the base encapsulation 630. The upper encapsulation 668 can be on and entirely cover the base encapsulation top side 632. The upper encapsulation 668 can surround or encapsulate the interposer interconnects 644.

The interposer structure 646 can be partially surrounded by the upper encapsulation 668. The upper encapsulation 668 can cover the vertical sides of the interposer structure 646. The interposer first side 648 of the interposer structure 646 can be exposed from the upper encapsulation 668. The interposer structure 646 can be exposed in a recess 670 in the side of the upper encapsulation 668 facing away from the base encapsulation 630. More specifically, the interposer substrate 652 can be exposed in the recess 670.

The upper encapsulation 668 can be on a peripheral portion of the interposer first side 648. The peripheral portion is defined as the portions along the perimeter of a horizontal surface.

The integrated circuit packaging system 600 can include a mountable device 672. The mountable device 672 is defined as a packaged integrated circuit device. The mountable device 672 can be over the interposer substrate 652 of the interposer structure 646.

The mountable device 672 can be attached to the portion of the interposer structure 646 exposed from the upper encapsulation 668. The mountable device 672 attached to the interposer structure 646 can form an integrated circuit package-on-package system.

The mountable device 672 can include a device substrate 674. The device substrate 674 is defined as a rigid structure that provides support and connectivity for mounting other components and devices. As an example, the device substrate 674 can be a laminated substrate or a ceramic substrate. As a further example, the laminated substrate can be a layered substrate having vias and intermetallic layers. As a specific example, the device substrate 674 can be a printed circuit board.

The device substrate 674 of the mountable device 672 can be connected to the interposer structure 646 with a mountable interconnects 676. The mountable interconnects 676 is defined as conductive structures for providing electrical connection between elements, devices, and other structures. As an example, the mountable interconnects 676 solder balls, solder bumps, conductive pillars, or conductive bumps. As a further example, the mountable interconnects 676 can be attached between the interposer substrate 652 and the device substrate 674.

A mountable integrated circuit 678 can be mounted on the device substrate 674. The mountable integrated circuit 678 is defined as an active device having active circuitry fabricated thereon (not shown). As an example, the mountable integrated circuit 678 can be a semiconductor die, a wirebond die, a think semiconductor die, or a flip chip.

The mountable integrated circuit 678 can be attached to the device substrate 674 with a device adhesive 680. The device adhesive 680 is defined as a material for physically bonding or adhering two or more components to each other. For example, the device adhesive 680 can be an epoxy or polymer adhesive, a b-stage or partially cured adhesive material, or a thermally conductive adhesive material. The device adhesive 680 can be between the device substrate 674 and the side of the mountable integrated circuit 678 facing the device substrate 674.

The mountable integrated circuit 678 can be connected to the device substrate 674 with mountable device interconnects 682. The mountable device interconnects 682 is defined as a conductive structures for providing electrical connection between elements, devices, and other structures. For example, the mountable device interconnects 682 can be a bond wire or a ribbon bond wire.

The mountable device interconnects 682 can connect between the device substrate 674 and the side of the mountable integrated circuit 678 having the active circuitry. The mountable device interconnects 682 can provide electrical connectivity between the mountable integrated circuit 678 and the device substrate 674.

The mountable device 672 can include a mountable device encapsulation 602. The mountable device encapsulation 602 is defined as a protective cover that has electric and environmental insulating properties providing a hermetic seal. As an example, the mountable device encapsulation 602 can be a molded encapsulation material, such as epoxy molding compound or ceramic material.

The mountable device encapsulation 602 can be on the side of the device substrate 674 facing away from the interposer encapsulation 662. The mountable device encapsulation 602 can surround or encapsulate the mountable integrated circuit 678, the device adhesive 680 and the mountable device interconnects 682.

It has been discovered that the present invention provides the integrated circuit packaging system 600, with the base conductive vias 636, having increased through connection within and between packaged devices. The base conductive vias 636 can enable manufacture of through interconnects having finer pitch, thus improving through connection within and between packaged devices, such as connection through the base encapsulation 630 to the interposer structure 646 and the mountable device 672.

It has also been discovered that the present invention provides the integrated circuit packaging system 600, with the base conductive vias 636, having reliable connectivity. The base conductive vias 636 having the tapered shape with the base via tip 638 enables precise connection with the base substrate 610 which reduces or eliminates the risk of shorting, providing the integrated circuit packaging system 600 having reliable connectivity.

It has further been discovered that the present invention provides the integrated circuit packaging system 600, with the base conductive vias 636 including the base via head 640, having robust interconnection. The base via head 640 having a width greater than the base via tip 638 provides a wider surface for attaching the interposer interconnects 644 which provide robust interconnection between the base conductive vias 636 and the interposer interconnects 644 of the integrated circuit packaging system 600.

It has further been discovered that the present invention provides the integrated circuit packaging system 600 with the base conductive vias 636 and the interposer interconnects 644 improves throughput. The base conductive vias 636 connected to the interposer interconnects 644 enable reduced manufacturing time compared to other vertical connections, such as bondwires, when forming electrical connections between structures, components and devices, such as the interposer structure 646 of the integrated circuit packaging system 600.

It has further been discovered the present invention provides the integrated circuit packaging system 600, with the base encapsulation 630 including the base encapsulation thickness 634, having reduced process time. The base encapsulation 630 having the base encapsulation thickness 634 equivalent to the distance between the base substrate first side 612 and the base circuit non-active side 622 reduces the distance and time required for the laser ablation process when forming the base conductive vias 636 of the integrated circuit packaging system 600.

It has further been discovered the present invention provides the integrated circuit packaging system 600, with the base encapsulation 630 including the base encapsulation thickness 634, having a low vertical package profile. The base encapsulation 630 having the base encapsulation thickness 634 equivalent to the distance between the base substrate first side 612 and the base circuit non-active side 622 enables uniform reduction in package height for the base encapsulation 630 and the base integrated circuit 618 providing the integrated circuit packaging system 600 having a low profile.

It has further been discovered the present invention provides the integrated circuit packaging system 600 with the base buffer connectors 642 prevents damage to the base substrate 610 during the via formation process. The base buffer connectors 642 provide a stable buffer which reduces manufacture sensitivity to light intensity variation in laser-ablating and drill tip height control or substrate thickness variation in mechanical drilling, preventing damage to the base substrate 610 of the integrated circuit packaging system 600.

It has further been discovered the present invention provides the integrated circuit packaging system 600 with the base buffer connectors 642 reduces process time. The base buffer connectors 642 reduces process time and reduces cost by eliminating the need for the base conductive vias 636 to extend to the base substrate 610 of the integrated circuit packaging system 600.

It has further been discovered the present invention provides the integrated circuit packaging system 600 with the upper encapsulation 668 having improved structural integrity. The upper encapsulation 668 formed over the peripheral portion of the interposer structure 646 prevents or eliminates the risk of disconnection from the interposer interconnects 644 by securing the interposer structure 646 in place which improves structure integrity of the integrated circuit packaging system 600.

It has further been discovered the present invention provides the integrated circuit packaging system 600 with the interposer structure 646 having increased connectivity. The interposer structure 646 exposed from the upper encapsulation 668 provides increased number of input and output sites for connect to other devices, components, and structures, such as the mountable device 672 of the integrated circuit packaging system 600.

It has further been discovered the present invention provides the integrated circuit packaging system 600, with the interposer structure 646 including the interposer circuit device 656, having increased packaging density. The interposer structure 646 having the interposer circuit device 656 increases the number of devices with active circuitry in the integrated circuit packaging system 600 providing an increase in packaging density.

Figure 7:
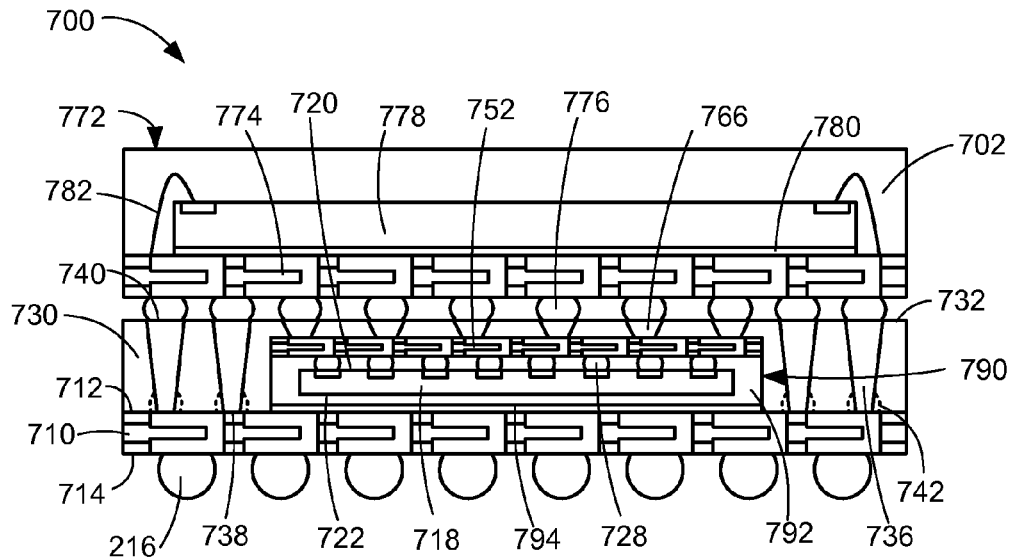
FIG. 7 is a cross-sectional view of an integrated circuit packaging system as exemplified by the line 2-2 of FIG. 1 in a sixth embodiment of the present invention.

Referring now to FIG. 7, therein is shown a cross-sectional view of an integrated circuit packaging system 700 as exemplified by the line 2-2 of FIG. 1 in a sixth embodiment of the present invention. The cross-sectional view depicts a base substrate 710. The base substrate 710 is defined as a rigid structure that provides support and connectivity for mounting other components and devices. As an example, the base substrate 710 can be a laminated substrate or a ceramic substrate. As a further example, the laminated substrate can be a layered substrate having vias and intermetallic layers. As a specific example, the base substrate 710 can be a printed circuit board.

The base substrate 710 can have a base substrate first side 712 and a base substrate second side 714. The base substrate first side 712 and the base substrate second side 714 can be the opposing horizontal sides of the base substrate 710 with the base substrate second side 714 facing away from the base substrate first side 712.

External interconnects 716 can be connected to the base substrate second side 714. The external interconnects 716 are defined as conductive connectors that provide connectivity between a packaging system and other devices and components. As an example, the external interconnects 716 solder balls, solder bumps, conductive pillars, or conductive bumps. The external interconnects 716 can connect the integrated circuit packaging system 700 to a next system level down (not shown).

An internal device 790 can be mounted on the base substrate 710. The internal device 790 is defined as a packaged circuit device for integration within another circuit packaging system. For example, the internal device 790 can be a packaged integrated circuit.

The internal device 790 can include an internal encapsulation 792. The internal encapsulation 792 is defined as a protective cover that has electric and environmental insulating properties providing a hermetic seal. As an example, the internal encapsulation 792 can be a molded encapsulation material, such as epoxy molding compound or ceramic material.

The internal device 790 can surround a base integrated circuit 718. The base integrated circuit 718 is defined as an active device having active circuitry fabricated thereon. As an example, the base integrated circuit 718 can be a semiconductor die, a thin semiconductor die, a wirebond die, or a flip chip.

The base integrated circuit 718 can have a base circuit active side 720 and a base circuit non-active side 722. The base circuit active side 720 is defined as the side of the base integrated circuit 718 having active circuitry fabricated thereon (not shown). The base circuit active side 720 can face away from the base substrate first side 712. The base circuit active side 720 can be parallel with the base circuit active side 720.

The base circuit non-active side 722 is defined as the side of the base integrated circuit 718 opposite the base circuit active side 720. The base circuit non-active side 722 can face the base substrate first side 712. The base circuit non-active side 722 can be parallel with the base circuit active side 720.

The internal device 790 can be attached to an interposer substrate 752. The interposer substrate 752 is defined as a rigid structure that provides support and connectivity for mounting other components and devices. As an example, the interposer substrate 752 can be a laminated substrate or a ceramic substrate. As a further example, the laminated substrate can be a layered substrate having vias and intermetallic layers. As a specific example, the interposer substrate 752 can be a printed circuit board. The base integrated circuit 718 can be between the interposer substrate 752 and the base substrate 710.

The base circuit active side 720 can be attached to the interposer substrate 752 with circuit interconnects 728. The circuit interconnects 728 are defined as conductive structures for providing electrical connection between elements, devices, and other structures. As an example, the circuit interconnects 728 solder balls, solder bumps, conductive pillars, or conductive bumps.

The internal encapsulation 792 can fill the space between the base circuit active side 720 and the interposer substrate 752. The internal encapsulation 792 can surround the circuit interconnects 728.

The internal encapsulation 792 can be formed around the base circuit non-active side 722. The internal encapsulation 792 can be between the base circuit non-active side 722 and the base substrate 710.

The internal device 790 can be attached to the base substrate first side 712 with an internal adhesive 794. The internal adhesive 794 is defined as a material for physically bonding or adhering two or more components to each other. For example, the internal adhesive 794 can be an epoxy or polymer adhesive, a b-stage or partially cured adhesive material, or a thermally conductive adhesive material. The side of the internal encapsulation 792 facing the base substrate first side 712 can be attached to the base substrate 710 with the internal adhesive 794.

A base encapsulation 730 can be on and cover the base substrate first side 712. The base encapsulation 730 is defined as a protective cover that has electric and environmental insulating properties providing a hermetic seal. As an example, the base encapsulation 730 can be a molded encapsulation material, such as epoxy molding compound or ceramic material.

The base encapsulation 730 can be on the side of the interposer substrate 752 facing away from the base substrate

710. The base encapsulation can cover the vertical sides of the internal encapsulation 792 and the internal adhesive 794.

The base encapsulation 730 can include a base encapsulation top side 732. The base encapsulation top side 732 is defined as the horizontal surface facing away from the base substrate 710. The base encapsulation top side 732 can be parallel with the base substrate first side 712.

Base conductive vias 736 can be in and surrounded by the base encapsulation 730. The base conductive vias 736 are defined as conductive structures in a protective cover that provide electrical connectivity and extend between a side of a substrate and a surface of the protective cover.

The base conductive vias 736 can extend vertically through the base encapsulation 730. The base conductive vias 736 can be attached to the base substrate 710 at one end of the base conductive vias 736 and exposed from the base encapsulation 730 at the opposing end of the base conductive vias 736.

The base conductive vias 736 can be a conductive structure formed from filling a hole or via (not shown) in the base encapsulation 730 with conductive material. As an example, the base conductive vias 736 can be made from conductive material, such as a copper alloy, gold, a gold alloy, nickel, a nickel alloy, or other alloys. The hole or via in the base encapsulation 730 can be formed by a laser ablation process. The hole or via can be formed to extend from the base encapsulation top side 732 to the base substrate first side 712.

Optionally, base buffer connectors 742, as depicted by the curved dashed lines, can be on the base substrate 710. The base buffer connectors 742 are defined as a physical buffer having electrically conductive properties that protects a substrate from damage during a laser drilling or ablation process. As an example, the base buffer connectors 742 prevent damage to the base substrate 710 during formation of the holes or vias for the base conductive vias 736 by functioning as a physical barrier for the base substrate 710.

The base buffer connectors 742 can be between the base substrate first side 712 and the base conductive vias 736. The base conductive vias 736 can be formed into the base buffer connectors 742.

The base conductive vias 736 can have a base via tip 738 and a base via head 740. The base via head 740 can be the portion of the base via tip 738 that is attached to the base substrate first side 712. The base via head 740 can be electrically connected to pads along the base substrate first side 712.

The base via head 740 is defined as the end of the base conductive vias 736 for providing connectivity to devices or structures stacked on the base conductive vias 736. The base via head 740 can be the portion of the base conductive vias 736 at end of the base conductive vias 736 opposite the base via tip 738. The base via head 740 can be exposed from the base encapsulation 730 along the base encapsulation top side 732. The base via head 740 can be coplanar with the base encapsulation top side 732.

The base conductive vias 736 can have a tapered shape. A tapered shape is defined as a shape having a narrowing width with one end having a greater width than an opposing end. For example, the base via head 740 can have a greater width than the base via tip 738.

Interposer substrate vias 766 can be in and surrounded by the base encapsulation 730. The interposer substrate vias 766 are defined as conductive structures in a protective cover that provide electrical connectivity and extend between a side of a substrate and a surface of the protective cover.

The interposer substrate vias 766 can extend vertically through the base encapsulation 730. The interposer substrate vias 766 can be attached to the side of the interposer substrate 752 facing away from the base encapsulation 730 at one end of the interposer substrate vias 766 and exposed from and coplanar with the base encapsulation top side 732 at the opposing end of the interposer substrate vias 766. The interposer substrate vias 766 can be formed by a process similar to that of used to form the base conductive vias 736.

The integrated circuit packaging system 700 can include a mountable device 772. The mountable device 772 is defined as a packaged integrated circuit device. The mountable device 772 can be over the base encapsulation top side 732. The mountable device 772 attached over the base encapsulation top side 732 can form an integrated circuit package-on-package system.

The mountable device 772 can include a device substrate 774. The device substrate 774 is defined as a rigid structure that provides support and connectivity for mounting other components and devices. As an example, the device substrate 774 can be a laminated substrate or a ceramic substrate. As a further example, the laminated substrate can be a layered substrate having vias and intermetallic layers. As a specific example, the device substrate 774 can be a printed circuit board.

The device substrate 774 of the mountable device 772 can be attached to the base conductive vias 736 and the interposer substrate vias 766 with mountable interconnects 776. The mountable interconnects 776 is defined as conductive structures for providing electrical connection between elements, devices, and other structures. As an example, the mountable interconnects 776 solder balls, solder bumps, conductive pillars, or conductive bumps.

A mountable integrated circuit 778 can be mounted on the device substrate 774. The mountable integrated circuit 778 is defined as an active device having active circuitry fabricated thereon (not shown). As an example, the mountable integrated circuit 778 can be a semiconductor die, a wirebond die, a think semiconductor die, or a flip chip.

The mountable integrated circuit 778 can be attached to the device substrate 774 with a device adhesive 780. The device adhesive 780 is defined as a material for physically bonding or adhering two or more components to each other. For example, the device adhesive 780 can be an epoxy or polymer adhesive, a b-stage or partially cured adhesive material, or a thermally conductive adhesive material. The device adhesive 780 can be between the device substrate 774 and the side of the mountable integrated circuit 778 facing the device substrate 774.

The mountable integrated circuit 778 can be connected to the device substrate 774 with mountable device interconnects 782. The mountable device interconnects 782 is defined as a conductive structures for providing electrical connection between elements, devices, and other structures. For example, the mountable device interconnects 782 can be a bond wire or a ribbon bond wire.

The mountable device interconnects 782 can connect between the device substrate 774 and the side of the mountable integrated circuit 778 having the active circuitry. The mountable device interconnects 782 can provide electrical connectivity between the mountable integrated circuit 778 and the device substrate 774.

The mountable device 772 can include a mountable device encapsulation 702. The mountable device encapsulation 702 is defined as a protective cover that has electric and environmental insulating properties providing a hermetic seal. As an example, the mountable device encapsulation 702 can be a molded encapsulation material, such as epoxy molding compound or ceramic material.

The mountable device encapsulation 702 can be on the side of the device substrate 774 facing away from the base encapsulation 730. The mountable device encapsulation 702 can surround or encapsulate the mountable integrated circuit 778, the device adhesive 780 and the mountable device interconnects 782.

It has been discovered that the present invention provides the integrated circuit packaging system 700, with the base conductive vias 736, having increased through connection within and between packaged devices. The base conductive vias 736 can enable manufacture of through interconnects having finer pitch, thus improving through connection within and between packaged devices, such as connection through the base encapsulation 730 to the mountable device 772.

It has also been discovered that the present invention provides the integrated circuit packaging system 700, with the base conductive vias 736, having reliable connectivity. The base conductive vias 736 having the tapered shape with the base via tip 738 enables precise connection with the base substrate 710 which reduces or eliminates the risk of shorting, providing the integrated circuit packaging system 700 having reliable connectivity.

It has further been discovered that the present invention provides the integrated circuit packaging system 700, with the base conductive vias 736 including the base via head 740, having robust interconnection. The base via head 740 having a width greater than the base via tip 738 provides a wider surface for attaching the mountable interconnects 776 which provide robust interconnection between the base conductive vias 736 and the mountable interconnects 776 of the integrated circuit packaging system 700.

It has further been discovered the present invention provides the integrated circuit packaging system 700 with the base buffer connectors 742 prevents damage to the base substrate 710 during the via formation process. The base buffer connectors 742 provide a stable buffer which reduces manufacture sensitivity to light intensity variation in laser-ablating and drill tip height control or substrate thickness variation in mechanical drilling, preventing damage to the base substrate 710 of the integrated circuit packaging system 700.

It has further been discovered the present invention provides the integrated circuit packaging system 700 with the base buffer connectors 742 reduces process time. The base buffer connectors 742 reduces process time and reduces cost by eliminating the need for the base conductive vias 736 to extend to the base substrate 710 of the integrated circuit packaging system 700.

Figure 8:
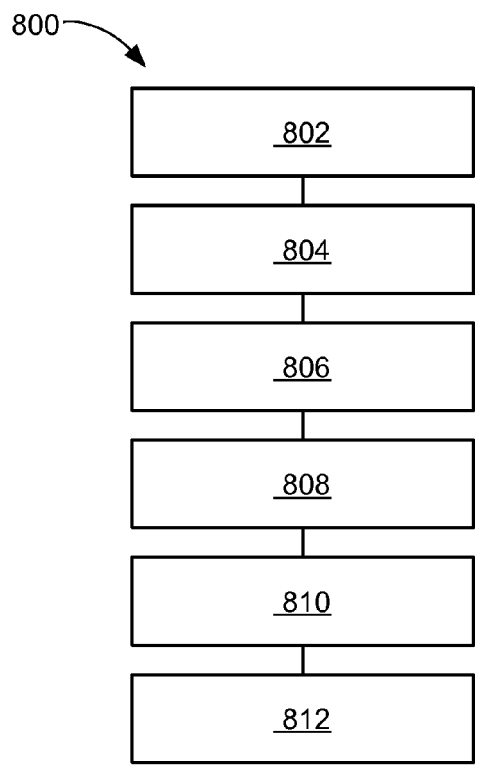
FIG. 8 is a flow chart of a method of manufacture of an integrated circuit packaging system in a further embodiment of the present invention.

Referring now to FIG. 8, therein is shown a flow chart of a method 800 of manufacture of an integrated circuit packaging system in a further embodiment of the present invention. The method 800 includes: providing a base substrate in a block 802; attaching a base integrated circuit on the base substrate in a block 804; forming a base encapsulation, having a base encapsulation top side, on the base substrate and around the base integrated circuit in a block 806; forming a base conductive via, having a base via head, through the base encapsulation and attached to the base substrate adjacent to the base integrated circuit, the base via head exposed from and coplanar with the base encapsulation top side in a block 808; mounting an interposer structure over the base encapsulation with the interposer structure connected to the base via head in a block 810; and forming an upper encapsulation on the base encapsulation top side and partially surrounding the interposer structure with a side of the interposer structure facing away from the base encapsulation exposed in a block 812.

Thus, it has been discovered that the integrated circuit packaging system of the present invention furnishes important and heretofore unknown and unavailable solutions, capabilities, and functional aspects for base conductive vias. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a base substrate;
   attaching a base integrated circuit on the base substrate;
   forming a base encapsulation, having a base encapsulation top side, on the base substrate and around the base integrated circuit;
   forming a base conductive via, having a base via head, through the base encapsulation and attached to the base substrate adjacent to the base integrated circuit, the base via head exposed from and coplanar with the base encapsulation top side;
   mounting an interposer structure over the base encapsulation with the interposer structure connected to the base via head; and
   forming an upper encapsulation in direct contact with the base encapsulation top side and partially surrounding the interposer structure with a side of the interposer structure facing away from the base encapsulation exposed.

2. The method as claimed in claim 1 wherein forming the upper encapsulation includes forming a recess in the side of the upper encapsulation facing away from the base encapsulation with the interposer structure exposed in the recess.

3. The method as claimed in claim 1 wherein forming the upper encapsulation includes forming the side of the upper encapsulation facing away from the base encapsulation coplanar with the exposed side of the interposer structure.

4. The method as claimed in claim 1 wherein attaching the base integrated circuit includes attaching the base integrated circuit having a base circuit via.

5. The method as claimed in claim 1 further comprising attaching a mountable device to the side of the interposer structure exposed from the upper encapsulation.

6. A method of manufacture of an integrated circuit packaging system comprising:
   providing a base substrate;
   attaching a base integrated circuit, having a base circuit active side and a base circuit non-active side, on the base substrate, the base circuit active side facing the base substrate;
   forming a base encapsulation, having a base encapsulation top side, on the base substrate and around the base integrated circuit, the base circuit non-active side exposed from and coplanar with the base encapsulation top side;

forming a base conductive via, having a base via head, through the base encapsulation and attached to the base substrate adjacent to the base integrated circuit, the base via head exposed from and coplanar with the base encapsulation top side;

mounting an interposer structure over the base encapsulation with the interposer structure connected to the base via head; and forming an upper encapsulation in direct contact with the base encapsulation top side, with the interface between the base encapsulation and upper encapsulation along a single horizontal plane, and partially surrounding the interposer structure with a side of the interposer structure facing away from the base encapsulation exposed.

7. The method as claimed in claim 6 wherein mounting the interposer structure over the base encapsulation includes attaching the interposer structure to the base via head with an interposer interconnect.

8. The method as claimed in claim 6 wherein mounting the interposer structure includes mounting the interposer structure having an interposer substrate.

9. The method as claimed in claim 6 wherein mounting the interposer structure includes mounting the interposer structure having an interposer circuit device.

10. The method as claimed in claim 6 wherein:

mounting the interposer structure includes mounting the interposer structure having an interposer circuit device and an interposer device via; and forming the upper encapsulation includes partially surrounding the interposer structure with the interposer device via exposed.

11. An integrated circuit packaging system comprising:
a base substrate;
a base integrated circuit attached on the base substrate;
a base encapsulation, having a base encapsulation top side, on the base substrate and around the base integrated circuit,
a base conductive via, having a base via head, through the base encapsulation and attached to the base substrate adjacent to the base integrated circuit, the base via head exposed from and coplanar with the base encapsulation top side;
an interposer structure over the base encapsulation and connected to the base via head; and
an upper encapsulation in direct contact with the base encapsulation top side and partially surrounding the interposer structure with the side of the interposer structure facing away from the base encapsulation exposed.

12. The system as claimed in claim 11 wherein the upper encapsulation includes a recess in the side of the upper encapsulation facing away from the base encapsulation with the interposer structure exposed in the recess.

13. The system as claimed in claim 11 wherein the side of the upper encapsulation facing away from the base encapsulation is coplanar with the exposed side of the interposer structure.

14. The system as claimed in claim 11 wherein the base integrated circuit includes a base circuit via.

15. The system as claimed in claim 11 further comprising a mountable device attached to the side of the interposer structure exposed from the upper encapsulation.

16. The system as claimed in claim 11 wherein:
the base integrated circuit includes a base circuit active side facing the base substrate and a base circuit non-active side; and
the base encapsulation top side is coplanar with the base circuit non-active side.

17. The system as claimed in claim 16 further comprising an interposer interconnect attached between the interposer structure and the base via head.

18. The system as claimed in claim 16 wherein the interposer structure includes an interposer substrate.

19. The system as claimed in claim 16 wherein the interposer structure includes an interposer circuit device.

20. The system as claimed in claim 16 wherein the interposer structure includes an interposer device via exposed from the upper encapsulation.

* * * * *